(12) United States Patent
Sher et al.

(10) Patent No.: US 6,930,503 B2
(45) Date of Patent: Aug. 16, 2005

(54) SYSTEM FOR TESTING INTEGRATED CIRCUIT DEVICES

(75) Inventors: Joseph C. Sher, Meridian, ID (US); David D. Siek, Boise, ID (US); Huy Thanh Vo, Boise, ID (US); Nicholas Van Heel, Eagle, ID (US); Victor Wong, Boise, ID (US); Hua Zheng, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/835,945

(22) Filed: Apr. 30, 2004

(65) Prior Publication Data

US 2004/0201399 A1 Oct. 14, 2004

(Under 37 CFR 1.47)

Related U.S. Application Data

(60) Continuation of application No. 10/295,499, filed on Nov. 15, 2002, now Pat. No. 6,756,805, which is a division of application No. 08/916,994, filed on Aug. 21, 1997, now Pat. No. 6,496,027.

(51) Int. Cl.[7] .................... G01R 31/26; G01R 31/02; G11C 29/00
(52) U.S. Cl. ................. 324/765; 324/158.1; 365/201
(58) Field of Search ................. 324/763, 765, 324/158.1; 365/201, 207, 189.09

(56) References Cited

U.S. PATENT DOCUMENTS

| | | | |
|---|---|---|---|
| 5,023,840 A | 6/1991 | Tobita | 365/201 |
| 5,039,877 A | 8/1991 | Chern | 307/296.2 |
| 5,065,091 A | 11/1991 | Tobita | 324/158 |
| 5,155,704 A | 10/1992 | Walther et al. | 365/201 |
| 5,182,529 A | 1/1993 | Chern | 331/57 |
| 5,212,442 A | 5/1993 | O'Toole et al. | 324/158 R |
| 5,245,577 A | 9/1993 | Duesman et al. | 365/201 |
| 5,369,317 A | 11/1994 | Casper et al. | 326/87 |
| 5,408,435 A | 4/1995 | McClure et al. | 365/201 |
| 5,550,778 A | 8/1996 | Takahashi | 365/207 |
| 5,555,166 A | 9/1996 | Sher | 363/49 |
| 5,666,049 A | 9/1997 | Yamada et al. | 324/158.1 |
| 5,712,575 A | 1/1998 | Ma et al. | 324/763 |
| 5,841,714 A | 11/1998 | Sher et al. | 365/201 |
| 5,848,010 A | 12/1998 | Sher | 365/201 |
| 5,949,725 A | 9/1999 | Sher | 365/201 |
| 6,009,029 A | 12/1999 | Sher | 365/201 |
| 6,496,027 B1 * | 12/2002 | Sher et al. | 324/765 |
| 6,756,805 B2 * | 6/2004 | Sher et al. | 324/765 |

* cited by examiner

Primary Examiner—Jermele Hollington
(74) Attorney, Agent, or Firm—Schwegman, Lundberg, Woessner & Kluth, P.A.

(57) ABSTRACT

A voltage generating circuit for generating internal voltage for a packaged integrated circuit memory device, is controllable to provide incremental adjustments in the voltage for testing of the memory device. The voltage generating circuit permits internally generated voltages of the memory device, such as the substrate voltage Vbb, the DVC2 voltage, and the pumped voltage Vccp, to be controlled externally through the application of test signals via the conventional test function, in performing standard device tests such as the static refresh test, logic 1s and 0s margin testing, and the like for packaged memory devices. Also, programmable circuits including programmable logic devices, such as anti-fuses, are provided that are programmable to maintain the voltage at a magnitude to which it is adjusted.

40 Claims, 10 Drawing Sheets

SYSTEM FOR TESTING INTEGRATED CIRCUIT DEVICES

This application is a Continuation of U.S. application Ser. No. 10/295,499, filed Nov. 15, 2002, now U.S. Pat. No. 6,756,805 which is a Divisional of U.S. application Ser. No. 08/916,994, filed Aug. 21, 1997, now U.S. Pat. No. 6,496,027, both of which are incorporated herein by reference.

FIELD OF THE INVENTION

The present invention relates to semiconductor integrated circuits, and in particular, the invention relates to a method and a voltage generating circuit for allowing packaged part testing of semiconductor integrated circuits by controlling internal voltages of the integrated circuits.

BACKGROUND OF THE INVENTION

Semiconductor integrated circuit devices, such as dynamic random access memory (DRAM) devices, undergo a tremendous amount of testing at various steps in the production process. Typically, DRAM devices are tested by using write and read operations to determine whether all of the cells of the memory array can properly store data signals and whether the data signals can be read out of the memory array. As memory chips become more dense, the testing time that is required to verify that data is being correctly stored and read out has increased dramatically.

In one test that is commonly used to identify faulty cells of a memory array, a signal having a logic level of either one or zero is applied to one group of the memory cells and signals of the opposite logic level are applied to the remaining cells. The signals are then read out of the cells individually and tested for the correct logic levels. This test must be repeated for each of the cells in the memory array and the entire procedure is repeated with signals of the opposite logic levels. Consequently, testing an array of memory cells requires a substantial amount of time.

Another procedure for testing memory cells in DRAM devices employs static refresh testing to identify faulty cells of the memory array. In this procedure, each memory cell is refreshed during a refresh cycle of a specified time interval. After the refresh operation has been completed, the data that is stored in all of the memory cells is checked to identify memory cells that failed to hold the stored data. Typically, such memory test requires 300 milliseconds of static refresh time for each memory cell depending on the value of the substrate voltage.

Consequently, the test time for a single memory chip can be excessive and when several hundred such chips on a wafer are tested sequentially the test time is considerable. When one considers the millions of parts that must be tested each month, the end result will be significant in terms of time spent and in terms of increase in time to market. The requirement that solid state memory devices be tested exhaustively, and the time required to perform these tests, greatly impact on the cost of the semiconductor devices. Therefore, it would be in the best interest of the semiconductor manufacturers to reduce the test time without compromising the quality of the tests.

A key indicator for margin quality of a semiconductor integrated circuit devices is the divide Vcc by two (DVC2) voltage margin for the integrated circuit devices. Accordingly, this indicator frequently is tested to insure quality of DRAM devices. For a DRAM device, the DVC2 margin is tested by increasing the voltage DVC2 to test for a logic 1 level margin and by lowering the voltage DVC2 to test for the logic 0 level margin. The margin test is generally run on packaged circuits. In many cases, this margin test procedure is conducted by hand, which is a very time intensive process. Because the voltage DVC2 is not bonded out to an external pin, the package has to be removed first before the test can even be started. Consequently, there is a high risk that the semiconductor device may be damaged during the testing process or in removing the packaging for conducting the margin test.

Accordingly, procedures have been developed, although not universally accepted. In one arrangement disclosed in U.S. Pat. No. 5,212,442, access is made to the DVC2 generator to permit the value to be changed. This arrangement uses a test vector and causes the substrate bias voltage generator to set the substrate bias voltage Vbb at ground or to be disabled. Another arrangement provides for setting the substrate voltage Vbb at ground or at a level that is more negative than ground. The negative voltage is applied by using an external pin, such as the pin by which a chip select signal is applied or the pin by which the output enable signal is applied. One shortcoming of this arrangement is that tests that require memory read or write operations cannot be performed when externally forcing either of these pins.

Another arrangement which is provided in a 256×16 DRAM memory device, commercially available from Micron Technology, Inc. as part number MT4C 16256, includes a test circuit that provides for selection of internal voltages such as the substrate bias Vbb, the wordline bias voltage Vccp, the cellplate bias or digitline equilibrating voltage DVC2. The test circuit includes that provides for setting the voltage Vbb at ground or at a more negative voltage, in the manner of the test circuit disclosed in U.S. Pat. No. 5,212,442, that is referenced above. In addition, the test circuit sets the voltage Vccp on or off. The test circuit provides the voltage DVC2 at a normal level, and setting it up to one higher value DVC2 up or down to one lower value DVC2 down.

A further goal of semiconductor manufacturers is to maximize yield. As technology advances decrease the feature size of the semiconductor elements and demands are made to increase the capacity of the memory array, the memory is more prone to defects that damage memory cells of memory devices. Typical memory device repair is accomplished by supplying a few redundant rows or/and columns, which are substituted for failed rows or columns of the memory.

For the reasons stated above, and for other reasons stated below which will become apparent to those skilled in the art upon reading and understanding the present specification, there is a need in the art for an improved method and voltage generating circuit for allowing packaged part testing of semiconductor integrated circuits to confirm proper operation of the circuits and to reduce the time that is required to perform the testing of the integrated circuit devices.

SUMMARY OF THE INVENTION

The present invention provides an internal voltage generating circuit for use in testing a functional circuit of an integrated circuit device that is enclosed within a package and which includes a test mode enabling circuit which is adapted to receive coded signals that are generated externally of the package. The test mode enabling circuit responsively produces an enabling signal internally of the package in response to the coded signal. The voltage generating circuit is enclosed within the package of the integrated circuit device and comprises an internal voltage generating circuit for generating an internal voltage internally of the package for the functional circuit. The internal voltage generating circuit includes a regulating circuit that maintains the internal voltage at a first setpoint. A control circuit of the voltage generating circuit responds to test vectors provided by the test mode circuits for controlling the regulating circuit to incrementally adjust the magnitude of the internal voltage. Thus, the invention permits internal voltages of the integrated circuit device to be controlled externally.

One internally generated voltage that can be controlled in accordance with the invention is the substrate voltage for the integrated circuit device. By activating different test vectors, the value of the substrate voltage will be changed. By selecting a more negative value for the substrate voltage for the static refresh test, a lower limit is set for the refresh test with an attendant reduction in the amount of time required for the refresh test. In accordance with a further embodiment, the invention enables margin testing to be carried out by controlling the voltage DVC2 used as the digitline equilibrating or cellplate bias voltage. Because no external supply voltages are required to conduct this test in accordance with the invention, the margin testings can be integrated into conventional production tests, saving time and reducing the time-to-market.

In accordance with another aspect of the invention, there is provided a system for producing test voltages for use in testing the integrated circuit device.

The system includes a voltage generating circuit for producing a voltage at a setpoint value, a test mode enable circuit for causing the integrated circuit device to operate in a test mode, and a test mode circuit for producing a plurality of test signals, each of the test signals representing a different value for the voltage produced by the voltage generating circuit. The system further includes a control circuit coupled to the voltage generating circuit and responsive to the test signals for incrementally adjusting the level of the voltage relative to the setpoint value.

Further in accordance with the invention, there is provided a method for producing test voltages for an integrated circuit memory device that includes an internal voltage generating circuit. The method includes enabling the voltage generating circuit to produce an internal voltage of a predetermined magnitude, generating a plurality of test signals, wherein each of the test signals represents a different incremental adjustment in the magnitude of the internal voltage relative to the predetermined magnitude, and applying the test signals to a control circuit in sequence to cause the control circuit to control the voltage generating circuit to incrementally adjust the magnitude the internal voltage. The method is particularly suitable for conducting static refresh tests of memory cells of an integrated circuit memory array and for conducting logic 1 and logic 0 level margin tests for such memory arrays, for example The test circuits provided by the invention provide for testing of an integrated circuit device, such as a dynamic random access memory device, by adjusting the value of internally generated voltages, such as the supply bias voltage, the digitline equilibrating voltage, or the cellplate bias voltage. Because no additional external pin is used in refresh testing of the memory device or in margin testing of the memory device, these test procedures can be integrated into the normal production tests. This will save time and the time-to-market to will be reduced.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
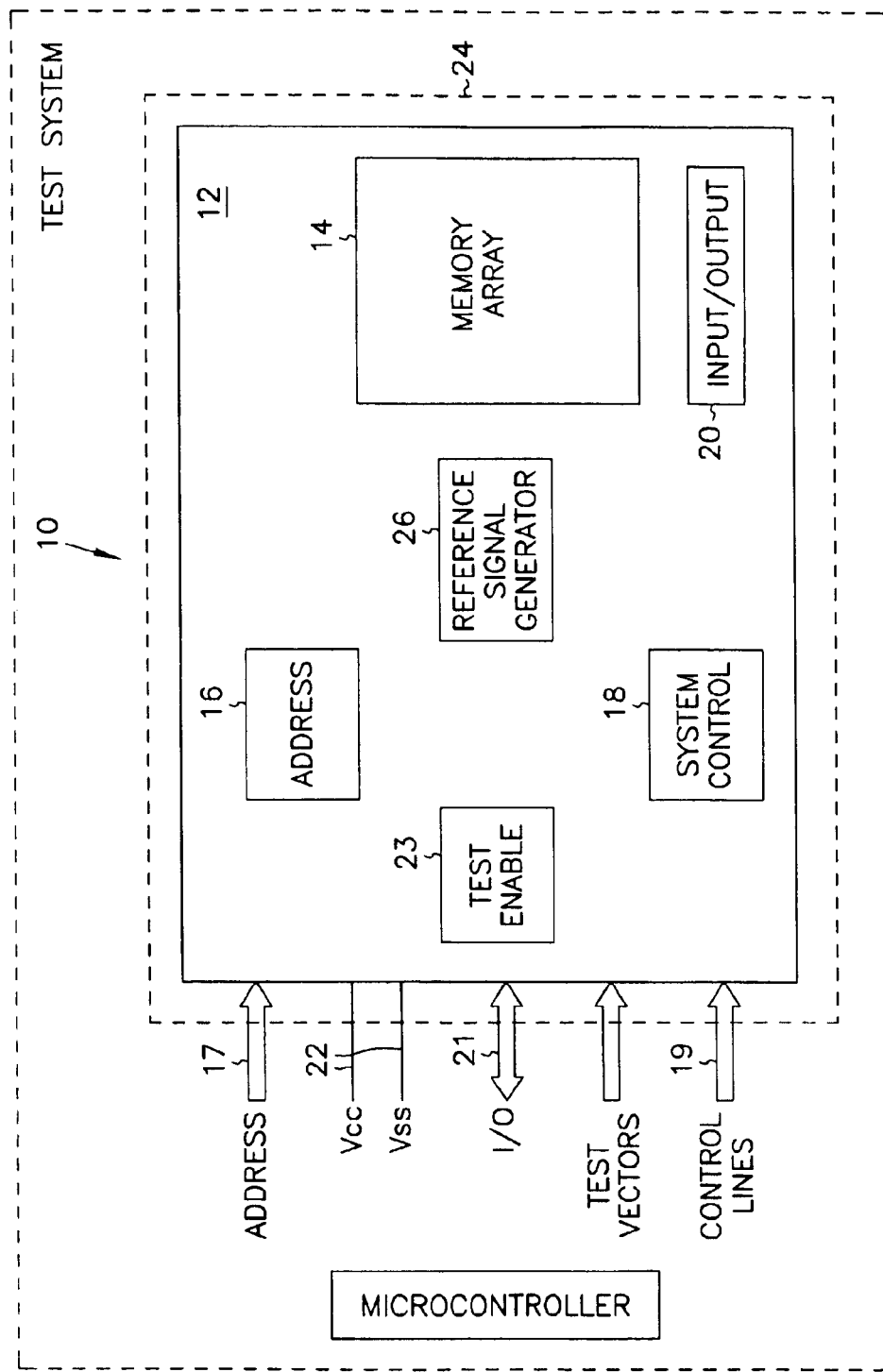
FIG. 1 is a block diagram of a packaged integrated circuit memory device incorporating the internal voltage generating circuit provided by the invention.

Referring to FIG. 1 of the drawings, the reference signal generating circuit provided by the invention is described with reference to an application in an integrated circuit memory device such as, a dynamic random access memory (DRAM) device. However, the reference signal generating circuit provided by the present invention can be fabricated in any integrated circuit device where it is required to control internally generated voltages, including bias voltages and reference voltages, for example. The reference signal generating circuit includes a voltage generating circuit and a control circuit which together form a test circuit that is particularly useful in applications to packaged integrated circuit devices which include test mode enable circuits and wherein the test mode enable circuits of the integrated circuit device serve as an interface between externally generated signals and the test circuit.

The DRAM device 10 includes an integrated circuit structure which includes a substrate 12 on which an array of memory cells 14 and address circuitry 16 for addressing the memory cells using address data supplied via external address lines 17 are formed. The memory device further includes memory system control circuitry 18 that is connected with an external micro-controller via external control lines 19, and input/output circuitry 20 that is connected to input/output lines 21 for receiving data to be stored in the memory array and to which data read out of the memory array are provided. The memory device 10 includes connections 22 to supply voltages Vcc and Vss. The supply voltage Vcc can be at a level of 5 volts supplied directly from an external supply, or can be supplied locally via a regulated supply (not shown), in which case the supply voltage Vcc is at a lower value, such as 3.8 volts. Typically, the voltage Vss is ground. The memory device further includes a test mode enable circuit 23. The integrated circuit memory array is enclosed within a package represented by the dashed line 24 in FIG. 1.

The reference signal generating circuit 26 is formed on the substrate 12 of the integrated circuit device and is enclosed within the package 24 of the integrated circuit device. In accordance with one embodiment of the invention, the internal voltage generating circuit 26 provides a substrate bias voltage Vbb. However, as will be shown, in other embodiments, the reference signal generating circuit provides a boosted wordline Vccp, a cellplate bias voltage or digitline equilibrating voltage DVC2 for the memory cells of the memory array, or some other internally generated signal that it is desirable to control externally of the integrated circuit device.

Conventionally, signals, such as the negative substrate bias voltage Vbb, the boosted wordline voltage Vccp, and the cellplate or digitline bias voltage DVC2, are internally generated voltages. That is, these voltages Vbb, Vccp and DVC2 are derived from the supply voltage by signal generating circuits fabricated in the integrated circuit device. These internally generated voltages Vbb, Vccp and DVC2 are maintained at design setpoint values by feedback arrangements provided by the reference generating circuit.

Digressing, one production test that is performed on each memory cell of the memory array is the static refresh test. The test is performed on memory cells that are storing a voltage corresponding to logic high or logic low levels. In the static refresh test, the memory cells are refreshed and then a pause is initiated. At the end of the time interval, the memory cells are read and any memory cell that has failed to retain sufficient charge to be read as the written logic high level is indicated as being a "failed" cell. It is pointed out that the terms "high" and "low" as used in this specification generally refer to voltages corresponding to the true and false binary logic values, respectively. Also, signals are generally considered "active" when they are at a logic high level. However, an asterisk following a signal name or mnemonic indicates that the signal has a negative or inverse logic and it is considered "active" when low.

Testing has demonstrated that semiconductor memory devices exhibit a linear characteristic in static refresh with respect to the substrate voltage Vbb. For example, if, during static refresh testing of a memory device, ten bits of the memory device under test fail under the condition of 300 milliseconds of static refresh and at a substrate voltage of −1.0 volts, these same ten bits will fail again with only 200 milliseconds of static refresh if the substrate voltage is decreased to −1.5 volts. In other words, these ten failed bits can be tested for static refresh using either 300 milliseconds or 200 milliseconds of static refresh time, depending on the magnitude of the substrate voltage. The more negative the substrate voltage that is used, the shorter the refresh test time that is required. In this example, 100 milliseconds have been saved per part per static refresh test. It is apparent that if 100 milliseconds can be saved for each part tested, the total time savings for the millions of parts being tested each month will be significant.

Figure 2:
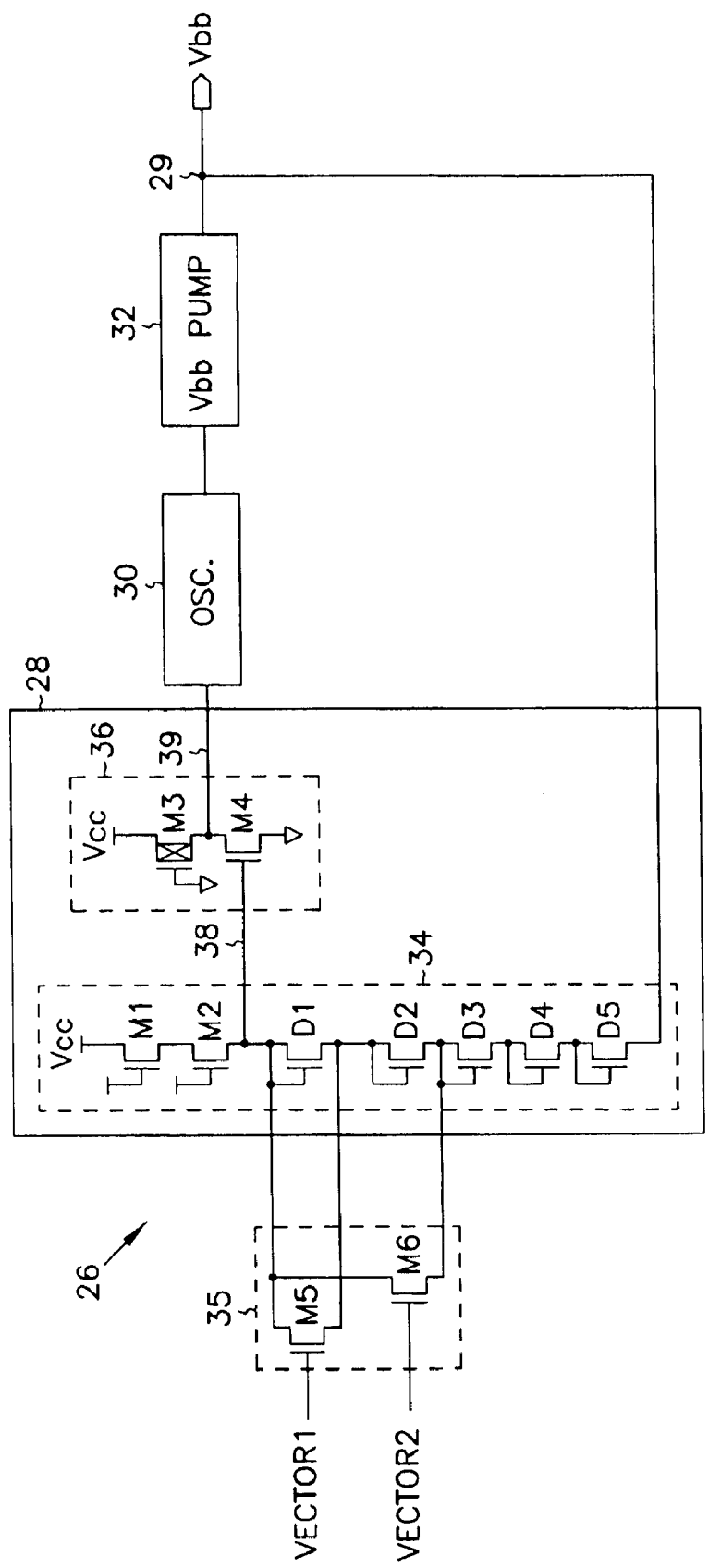
FIG. 2 is a schematic circuit diagram of an internal voltage generating circuit for producing a substrate bias in accordance with the invention.
Figure 3:
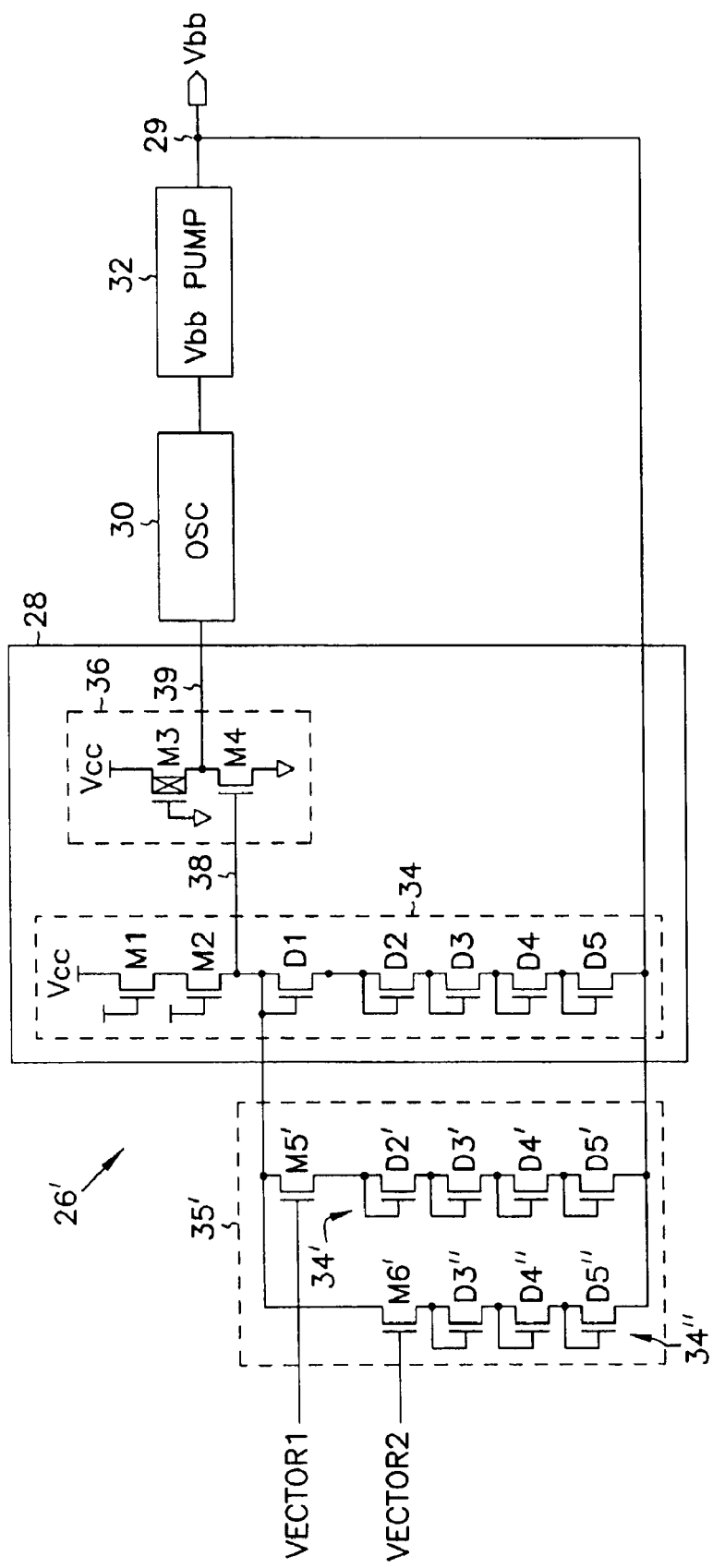
FIG. 3 is a schematic circuit diagram of an internal voltage generating circuit for producing a substrate bias in accordance with another embodiment of the invention.

Substrate Bias Generating Circuit (FIGS. 2–3)

Referring to FIG. 2, in one exemplary embodiment, the reference signal generating circuit 26 functions as a substrate bias supply for providing a negative bias voltage Vbb for application to the substrate layer 12, or to a well, of the integrated circuit device. The reference signal generating circuit 26 includes an internal voltage generating circuit including a regulating circuit 28, an oscillator circuit 30 and a charge pump circuit 32. The oscillator and charge pump circuit produce the internal voltage and the regulating circuit establishes a setpoint value for the voltage and maintains the voltage at the setpoint value. The negative substrate bias voltage Vbb is provided at a bias output node 29 of the voltage generating circuit 26. The Vbb bias output node 29 is connected to the substrate 12 of the integrated circuit device. The oscillator circuit 30 and the charge pump circuit 32 are conventional circuits and accordingly, will not be described in detail.

The regulating circuit 28 controls the on/off cycling of the oscillator circuit 30 and the charge pump circuit 32 to regulate the substrate bias voltage Vbb in the manner known in the art. The regulating circuit 28 includes a fixed reference or setpoint circuit 34, a control circuit 35 and an output driver circuit 36. The setpoint circuit 34 and the output driver circuits 36 are conventional circuits. The setpoint circuit includes a pair of gated on —channel, field-effect transistors M1 and M2 which are coupled between the Vcc supply rail and an intermediate node 38, and a plurality of diode-connected transistors D1 through D5 which are connected in series between the intermediate node 38 and the Vbb bias output node 29. The Vbb bias node 29 is connected to an input of the regulating circuit 28 so that the substrate bias voltage Vbb is fed back to the regulating circuit 28. This enables the regulating circuit to respond to a change in the substrate bias voltage relative to the turn-on threshold for the output driver circuit 36 and cause the enabling of the oscillator circuit 30 and the charge pump circuit 32.

The output driver circuit 36 includes a p-channel field-effect transistor M3 and an-channel input switching field-effect transistor M4 which function as a static inverter. The gate electrode of transistor M4, which is the input of the output driver circuit 36, is connected at node 38 to the junction of transistor M2 and transistor D1, which is the output of the setpoint circuit 34. The output of the output driver circuit, at node 39, is coupled to the input of the oscillator circuit 30.

The control circuit 35 is comprised of field-effect transistor M5 and field-effect transistor M6. In this embodiment, the control transistors control the diode string of the conventional setpoint circuit. Transistor M5 is connected in parallel with transistor D1. Transistor M6 is connected in parallel with transistors D1 and D2. The gate electrode of transistor M5 is connected to receive a test mode signal, or test vector Vector1. The gate electrode of transistor M6 is connected to receive a test mode signal, or test Vector2. The test vectors Vector1 and Vector2 are a logic 1 true state for the —channel type devices and are activated by using the test mode enable circuit 23 shown in FIG. 1, or using any other conventional test mode functions that are known in the art. In the exemplary embodiment, the test vectors are activated in response to the application of coded address signals to the test mode enable circuit 23 (FIG. 1) which responsively produces test vector Vector1 and/or Vector2 for application to the voltage generating circuit 26.

In operation, the voltage generating circuit 26 regulates the substrate bias voltage Vbb to a voltage between 0 and −2 volts. A typical nominal level for the substrate voltage Vbb is −1.2 to −1.4 volts, the actual voltage level depending upon the design of the integrated circuit. The number and size of the transistors D1–D5 of the level shifting circuit are selected such that transistor M4 is just barely off if the substrate voltage Vbb is at the nominal level. As is known, the nominal substrate voltage Vbb can change to a more positive level such as −0.8 volts due to a change in operation status or in the environmental conditions of the integrated circuit.

When the level of the substrate voltage Vbb rises, moving from a negative value towards zero volts, the voltage at node 38 also rises. When the voltage at node 38 reaches the turn-on threshold for transistor M4, the field-effect transistor M4 turns on and node 39 transitions from a logic high level to a logic low level. This causes the oscillator circuit 30 and the charge pump circuit 32 to be turned on. When the oscillator circuit and the charge pump circuit turn on, the substrate bias voltage Vbb is driven more negative. This, in turn, pulls down the voltage at node 38 causing transistor M4 being turned off when the gate potential decreases below the turn-off threshold voltage of transistor M4. The oscillator and charge pump circuits are turned off in response to transistor M4 being turned off.

The invention provides for incremental adjustment in the substrate bias voltage Vbb by controlling the number of diode-connected devices that are effective in establishing the turn-on setpoint for the regulating circuit 28. The control is effected externally of the integrated circuit package by selectively activating test vectors to cause a corresponding change in the regulated value of Vbb. Node 38 is usually at the threshold voltage Vt for transistor M4. The fewer the number of diodes that are connected in series between nodes 38 and 29, the less negative the value of Vbb will be maintained because the charge pump circuit is turned on less frequently. The number of diode-connected devices that are effectively connected in series between nodes 38 and 29, and thus the set point value for Vbb, is determined by the test vector that is activated. For example, by setting test vector Vector1 to logic 0, and setting test Vector2 to logic 1, which condition is assumed to be a default condition, transistors D1 and D2 are effectively bypassed, providing a first level for the bias voltage Vbb, making Vbb more negative relative to its nominal value. Setting test vector Vector1=1 and setting test vector Vector2=0 causes transistor M5 to conduct, bypassing transistor D1, decreasing the threshold setting for the voltage at node 38 by the amount of the voltage drop that had been provided by D1 to provide a first incremental adjustment in the bias voltage Vbb, making Vbb even more negative. Setting both test vectors Vector1 and Vector2 to logic 0, provides a second incremental adjustment in the value of Vbb, resulting in an even more negative value for Vbb. In these three cases, the charge pump 32 is turned successively less frequently, causing the substrate voltage Vbb to be driven more negative. By selecting a more negative value for the substrate voltage Vbb for the static refresh test, a lower limit is set for the refresh test and, consequently, a shorter test time is required. Although the exemplary embodiment of the voltage generating circuit shown in FIG. 2 responds to only two test vectors, it is apparent that the control circuit 35 can include additional control transistors, such as transistors M5 and M6, to increase the number of increments over which the substrate voltage can be adjusted.

Referring to FIG. 3, there is illustrated a further embodiment of an internal voltage generating circuit 26' for producing an incrementally adjustable substrate bias voltage Vbb in accordance with the invention. The voltage generating circuit 26' is similar to the voltage generating circuit 26 shown in FIG. 2, and accordingly, elements of the signal generating circuit of FIG. 3 have been given the same reference numbers as like or corresponding components of the signal generating circuit of FIG. 2.

In this embodiment, the transistors D1–D5 which establish the turn-on threshold for the field effect transistor M5 of the output circuit 36 are not controlled by the control circuit 35'. Rather, the control circuit 35' is responsive to test vectors to selectively connect adjustable or variable reference or level shifting circuits 34' and 34" to the input of the output driver circuit 36, in parallel with the diode string D1–D5. Level shifting circuit 34' is formed by four transistors D2'–D5' and a level shifting circuit 34" is formed by three transistors D3"–D5". The control circuit 35' further includes a field-effect transistor M5' which is connected in series with transistors D2'–D5' between node 38 and the substrate bias node 29. The transistor M5' is responsive to test vector Vector1 to connect level shifting circuit 34' between nodes 38 and 29, in parallel with transistors D1–D5 to clamp node 38 at voltage provided by the transistors D2'–D5'. Similarly, a field-effect transistor M6' is connected in series with transistors D3"–D5" between node 38 and the substrate bias at node 29 and is responsive to test vector Vector2 to connect transistors D3"–D5" between nodes 38 and 29, in parallel with transistors D1–D5, to clamp node 38 at a voltage provided by the transistors D3"–D5".

The operation of the test circuit illustrated in FIG. 3 is similar to the operation of the test circuit shown in FIG. 2 in that test vectors are used to selectively turn on the field-effect transistors M5' and M6' to cause a shift in the turn-on threshold of the regulating circuit 28 of the voltage generating circuit 26' to provide incremental adjustment in the substrate bias voltage, making the substrate bias voltage less negative. In this embodiment, test vector signal Vector1 is used to turn on field effect transistor M5' and test vector Vector2 is used to turn on transistor M6' to produce different voltage detection levels at node 38. The manner of operation of the voltage generating circuit 26' is apparent from the foregoing description of the voltage generating circuit 26 illustrated in FIG. 2, and accordingly, will not be described in detail.

Substrate Bias Generating Circuit (FIGS. 4–7)

Figure 4:
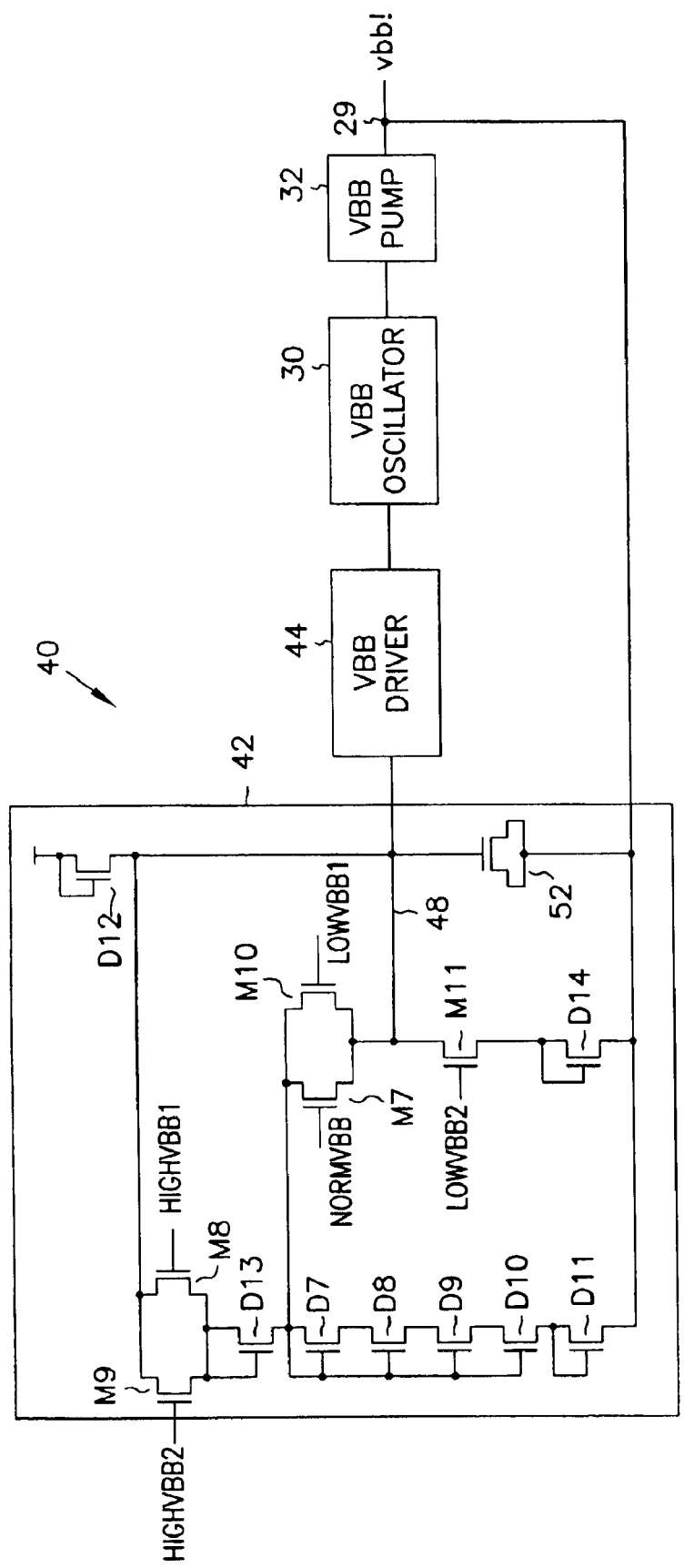
FIG. 4 is a schematic circuit diagram of another embodiment of a substrate bias generating circuit which allows the voltage to be maintained at a level to which it has been adjusted in accordance with the invention.

Referring to FIG. 4, there is illustrated a further embodiment, an internal voltage generating circuit that is controllable using a test arrangement provided by the invention. In the exemplary embodiment, the voltage generating circuit is a Vbb substrate bias generating circuit. The voltage generating circuit is adapted to respond to a plurality of test vectors to provide a plurality of discrete shifts in the level of the bias voltage Vbb that is produced by the signal generating circuit. As will be described, the test arrangement includes a memory system which allows an optimum or preferred bias level for the substrate voltage, determined through testing of the memory device, to be maintained after the testing of the memory device has been completed, by selectively activating a programmable logic device as will be described. This feature enhances the recovery of failed memory devices by allowing the failed memory devices to be reprogrammed to different operating levels for the various internal voltages required by the memory devices.

More specifically, the voltage generating circuit includes a regulating circuit 40, oscillator circuit 30 and a pump circuit 32. The regulating circuit 40 includes a setpoint circuit 42 and an output driver circuit 44. The oscillator circuit 30 and the pump circuit 32 are conventional circuits, and accordingly, will not be described in detail.

The setpoint circuit 42 includes —type field effect transistors M7–M11 and diode-connected —type field effect transistors D7–D14. Transistors D7–D11 are connected in series between an intermediate node 46 and the Vbb rail 29, forming one branch of the fixed reference or setpoint circuit 42 for the regulating circuit. The gate electrodes of transistors D7–D10 are connected together. Transistor M7 is connected between the intermediate node 46 and a node 48 which is connected to the input of the output driver stage 44.

Diode-connected transistor D12, transistor M8 and diode-connected transistor D13 are connected in series between the Vbb rail and the intermediate node 46, forming another branch of the setpoint circuit. Transistor M9 is connected in parallel with transistor M8. Transistor M10 is connected in parallel with transistor M7 between the intermediate node 46 and node 48. Transistor M11 is connected in series with diode-connected transistor D14 between node 48 and the Vbb rail, forming a further branch of the setpoint circuit. A capacitor 52 is connected between node 48 and the Vbb rail 29.

The gate electrode of transistor M7 is connected to receive a test vector NORMVBB. The gate electrode of transistor M8 is connected to receive a test vector HIGHVBB1. The gate electrode of transistor M9 is connected to receive a test vector HIGHVBB2. The gate electrode of transistor M10 is connected to receive a test vector LOWVBB1. The gate electrode of transistor M11 is connected to receive a test vector LOWVBB2.

In one embodiment, transistor M7 had a width-to-length ratio of 6/300, transistor M10 had a width to length ratio of 20/2, transistor M8 had a width-to-length ratio of 6/20, transistor M9 had a width-to-length ratio of 6/300, and transistor M11 had a width-to-length ratio of 6/200. Thus, the channel length of transistor M9 is greater than the channel length of transistor M8 and the channel length of transistor M7 is greater than the channel length of transistor M10, with transistors M7–M10 all having the same channel width.

Figure 5:
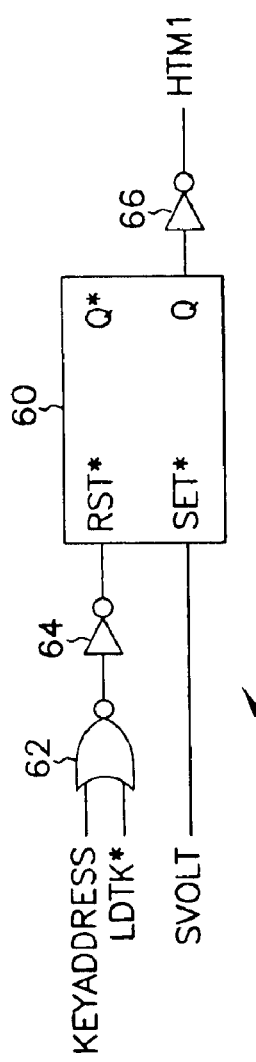
FIG. 5 is a block diagram of a test circuit for producing test signals for the voltage generating circuit of FIG. 4.
Figure 6:
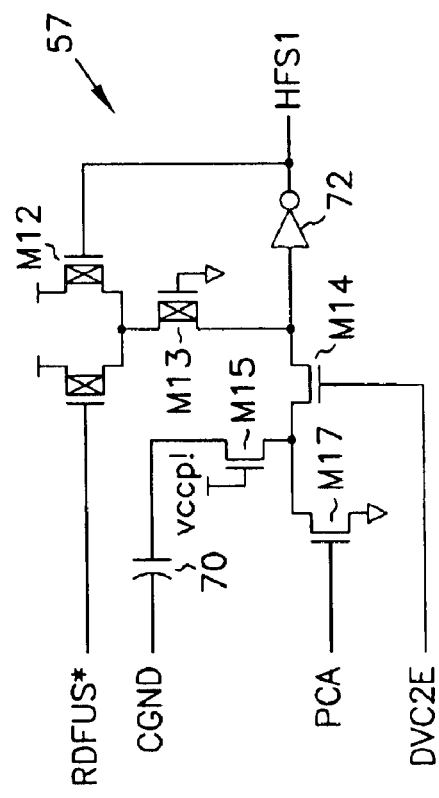
FIG. 6 is a schematic circuit diagram of an anti-fuse circuit for providing signals for the voltage generating circuit of FIG. 4 for maintaining the voltage at an adjusted level.
Figure 7:
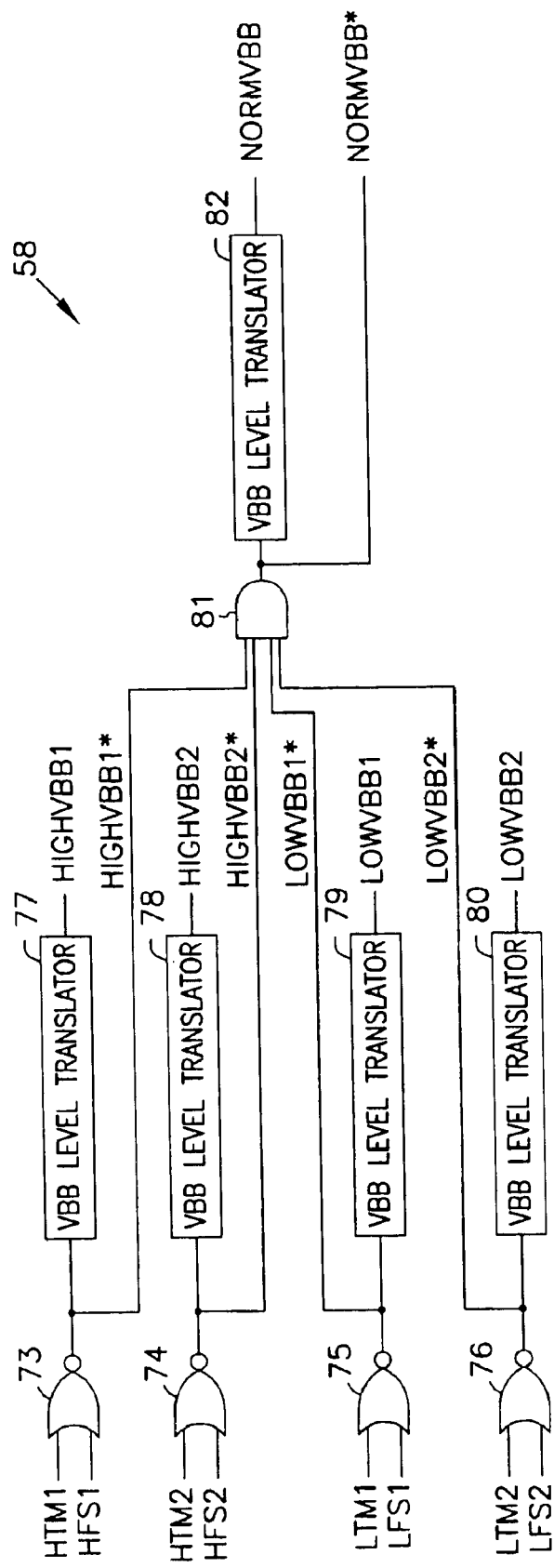
FIG. 7 is a block diagram of logic circuits for producing test signals for the voltage generating circuit of FIG. 4.

Referring to FIGS. 5–7, the five test vectors NORMVBB, HIGHVBB1 (which produces a value of Vbb that is more negative than the "normal" or nominal value of Vbb, or at a first more negative level), HIGHVBB2 (which produces a value of Vbb that is more negative than that produced by HIGHVBB1, or at a second more negative level), LOWVBB1 (which produces a value of Vbb that is less negative than the nominal value of Vbb, or at a first less negative level) and LOWVBB2 (which produces a value of Vbb that is less negative than that produced by LOWVBB1, or at a second less negative level) are generated by logic circuits including a plurality of test mode circuits, such as test mode circuit 56 shown in FIG. 5, a plurality of programmable circuits, such as programmable circuit 57 shown in FIG. 6, and NOR/NAND logic circuits 58 shown in FIG. 7. Four such test mode circuits and four such programmable circuits are provided for use in producing the five test vectors. The test mode circuits are identical and accordingly, only test mode circuit 56 is described in detail. Test mode circuit 56 produces a test signal HTM1 which is supplied to the logic circuits 58. The other test mode circuits produce test signals HTM2, LTM1 and LTM2 for the logic circuits 58. Moreover, the programmable circuits are identical and accordingly, only programmable circuit 57 is described in detail. The programmable circuit 57 produces a test signal HFS1 which is supplied to the logic circuits 58. The other programmable circuits produce test signals HFS2, LFS1 and LFS2 for the logic circuits 58. The NOR/NAND logic circuits 58 logically combine the outputs of the four test mode circuits and of the four programmable circuits to produce the five test vectors.

More specifically, referring to FIG. 5, each test mode circuit, such as test mode circuit 56 which produces test signal HTM1, includes a latch circuit 60, a NOR gate 62 and inverters 64 and 66. The latch circuit 60 has its set input SET* connected to receive a set signal SVOLT. The true output Q of the latch circuit 60 is connected to inverter 66 which provides the test signal HTM1 at its output. The NOR gate 62 and inverter 64 produce a low state active reset signal which is applied to the reset input RST* of the latch circuit 60. The NOR gate 62 has a first input connected to receive a test key address signal KEYADDRESS and a second input connected to receive a load test key signal LDTK*. The test key address signal is produced by the test mode enable circuit 23 (FIG. 1) in response to a coded address signal that indicates that the substrate bias voltage Vbb is to be increased to a first increased level relative to a nominal value for the bias voltage Vbb. By way of example, the nominal value can be −1.2 to −1.4 volts and the first increased level can be −1.6 volts. The load test key signal LDTK* is provided by the test mode enable circuit in response to each coded address signal indicating that an adjustment is to made in the substrate bias Vbb.

As is indicated above, a further test mode circuit (not shown) responds to further key address signal to produce a test signal HTM2, which forces the negative substrate bias voltage Vbb to a more negative level, such as −2 volts relative to the nominal level of −1.2 to −1.4 volts for the substrate bias voltage. Also, further test mode circuits (not shown) respond to further key address signals to produce test signals LTM1 and LTM2, which cause the substrate bias voltage Vbb to be at less negative first and second levels, respectively, relative to a nominal value for the substrate bias voltage Vbb. By way of example, the first and second less negative levels can be −1 volts and −0.8 volts.

Referring to FIG. 6, the programmable circuits can include any suitable programmable logic device, such as fuse devices or anti-fuse devices, or can comprise a latch circuit or other storage device or mechanism. In the exemplary embodiment, the programmable circuits include programmable logic devices embodied as anti-fuses. Accordingly, the programmable circuits are referred to hereinafter as anti-fuse circuits. Each anti-fuse circuit, such as anti-fuse circuit 57, includes an anti-fuse device 70. The anti-fuse device 70 is connected between the Vcc rail and a ground connection CGND through a p-type field-effect transistor M12, a gated-on p-type field-effect transistor M13, an —type field-effect transistor M14 and an —type field-effect transistor M15. The anti-fuse circuit 57 is a conventional circuit and the test signal HFS1 that is provided at the output of an inverter 72 is at a logic low level when the anti-fuse is unblown and at a logic high level when the anti-fuse is blown. The test signal HFS1 produced by anti-fuse circuit 57 indicates that the substrate bias voltage Vbb is to be maintained at the first increased level relative to the nominal value for the bias voltage Vbb. The anti-fuse 70 can be programmed in the conventional manner by applying a high voltage to the ground connection input CGND while pass transistor M14 isolates the anti-fuse 70 from a detection node 59 and while a programming transistor M15 provides a ground connection, through transistor M16, to the other terminal of the anti-fuse 70.

Similarly, a further anti-fuse circuit (not shown) is programmable to produce test signal HFS2, which causes the substrate bias Vbb to be maintained at the second increased level relative to the nominal value. Also, further test mode circuits (not shown) are programmable to produce test signals LFS1 and LFS2, which cause the substrate bias Vbb to be maintained at the first and second decreased levels, respectively, relative to the nominal value for the substrate bias Vbb.

Referring now to FIG. 7, the logic circuits 58 include four two-input NOR gates 73–76 having associated level translators 77–80 and a four-input NAND gate 81 having an associated Vbb level translator 82. The test signals HTM1 and HFS1 are combined by NOR gate 73 the output of which is translated by level translator 77 to produce test vector signal HIGHVBB 1. The output of NOR gate 73 is the complement test vector signal HIGHVBB 1*. Similarly, test signals HTM2 and HFS2 are combined by NOR gate 74, signals LTM1 and LFS 1 are combined by NOR gate 75 and signal LTM2 and LFS2 are combined by NOR gate 76. These signals are translated by Vbb level translators 78, 79 and 80, respectively, to provide the test vector signals HIGHVBB2, LOWVBB 1 and LOWVBB2. The NOR gates provide the complement test vectors HIGHVBB2*, LOWVBB1* and LOWVBB2*, respectively. The four complement test vectors are combined by NAND gate 81 and translated by Vbb level translator 82 to produce the test vector signal NORMVBB.

The operation of the test circuit is now described with reference to FIGS. 4–7. In the idle condition, and before programming any of the anti-fuses 70 to their blown conditions, test signals HTM1, HTM2, LTM1 LTM2, HFS1, HFS2, LFS1 and LFS2 are all at logic low levels. Accordingly, NOR gates 73–76 are enabled so that the complementary state test vectors HIGHVBB1*, HIGHVBB1*, LOWVBB1* and LOWVBB2* are all at a logic high level. Thus, NAND gate 81 is enabled and the output of NAND gate 81 is at a logic low level. For such condition, test vector NORMVBB, produced by Vbb level translator 82, is at a logic high level. The test vector NORMVBB enables transistor M7, connecting intermediate node 46 to the node 48 at the input to the output driver stage 44 so that the diode string D7–D11, which comprise the fixed reference circuit, is connected between node 48 and the Vbb rail 29. This is the normal operating condition for the signal generating circuit 26 and establishes the turn-on threshold for the output driver stage 44 that maintains the substrate bias voltage Vbb at its nominal value.

To temporarily increase the negative substrate bias voltage Vbb to the first increased level, for example, a coded address is applied to the test enable circuit 23. In response to the coded address, the test enable circuit 23 produces the signal SVOLT for setting all of the test mode circuits, including test mode circuit 57. Thus, the test signals HTM1, HTM2, LTM1 and LTM2 are all at logic low levels. Also, it is assumed that all of the anti-fuses 70 are in an unblown condition so that test signals HFS1, HFS2, LFS1 and LFS2 are all at logic low levels.

In addition, the test enable circuit 23 decodes the coded address and produces the test signal KEYADDRESS signal for NOR gate 62. Then, the test enable circuit 23 applies the active low test enable signal LDTK* to the "load" inputs of all of the NOR gates, including NOR gate 62. Accordingly, latch circuit 60 is reset, causing its true output Q to become a logic low level so that the output of inverter 66 becomes a logic high level, providing a logic high level for test signal HTM1. However, the latch circuits of the other three test mode circuits remain set and the test signals HTM2, LTM1 and LTM2 remain at logic low level. When test signal HTM1 becomes a logic high level, NOR gate 73 is disabled and its output becomes a logic low level. This causes NAND gate 81 to be disabled so that test vector NORMVBB becomes a logic low level, turning off transistor M7 to disconnect node 46 from node 48, to disconnect the diode string D7–D11 from node 48. In addition, test vector HIGHVBB1, which is provided by Vbb level translator ]77, becomes a logic high level causing transistor M8 to conduct so that node 46 is coupled to node 48 through diode-connected transistor D13 and transistor M8. Consequently, the threshold detection level established on node 48 for the output driver stage 44 is increased toward Vbb, causing the magnitude of the bias voltage Vbb to be adjusted downwards to the first level.

Testing of the memory device can be conducted while the substrate bias voltage Vbb is maintained at this first increased level. To return the substrate bias Vbb to its nominal level, a further coded address signal is supplied to the test enable circuit 23 for causing the test enable circuit to produce the reset signal SVOLT which sets all of the latch circuits, including the latch circuit 60. When the latch circuit 60 is set, test signal HTM1 becomes a logic 0 level. This causes NOR gate 73 to be re-enabled so that test vector HIGHVBB 1 becomes a logic low level turning off transistor M8 and test vector NORMVBB becomes a logic high level, enabling NAND gate 81 to cause test vector NORMVBB to become a logic high level for turning on transistor M7.

In a similar manner, the negative substrate bias voltage Vbb can be set to a second higher level by causing test vector HIGHVBB2 to become a logic high level by resetting the latch circuit of the test mode circuit that produces the test signal HTM2. Test vector HIGHVBB2, when at a logic high level, causes transistor M9 to conduct. Transistor M9 provides a larger voltage drop than does transistor M8 (because transistor M9 has a longer channel length than does transistor M8, and both have the same channel width) so that the that node 48 is clamped at higher level, raising the threshold setting for the output driver stage 44. The operation can be returned to normal by setting the latch circuit that produces test signal HTM2, causing test vector HIGHVBB2 to become a logic low level. Also, test vector NORMVBB again becomes a logic high level.

Similarly, the substrate bias voltage Vbb can be adjusted to a first decreased level, relative to its nominal value, by resetting the latch that produces the test signal LTM1, causing test vector LOWVBB 1 to become a logic high level and causing test vector NORMVBB to become a logic low level. These conditions cause transistor M10 to conduct and causes transistor M7 to be turned off. Consequently, the diode string D7–11 is connected to node 48 through transistor M10. The substrate voltage Vbb can be restored to its nominal value by setting the latch circuit to cause test signal LTM1 to become a logic high level.

Moreover, the substrate bias voltage Vbb can be adjusted to a second decreased level, relative to its nominal value, by resetting the latch that produces the test signal LTM2. This causes the test vector LVBB2 to become a logic high level and causes test vector NORMVBB to become a logic low level. These conditions cause transistor M11 to conduct and cause transistor M7 to be turned off. For these conditions, the diode string D7–D11 is isolated from node 48, and the node 48 is connected to the Vbb rail 29 through the transistor M11 and diode-connected transistor D14. The substrate bias can be returned to its nominal value by setting the latch circuit that produces the test signal LTM2 to cause the test vector LOWVBB2 to become a logic low level and causing test vector NORMVBB to become a logic high level.

The test vectors HIGHVBB1, HIGHVBB2, LOWVBB1 and LOWVBB2 can be generated in any sequence desired as a function of the test being performed, and as a function of the response of the integrated circuit device to the change in the negative substrate bias Vbb. It is pointed out that whenever any one of the anti-fuses is in a blown condition, the output of the anti-fuse circuit is permanently maintained at a logic high level so that the corresponding one of the NOR gates 73–76 is maintained disabled, regardless of the state of the test signals HTM1, HTM2, LTM1 and LTM2.

If testing of a failed memory device and analysis of the test data indicate that the memory device can be salvaged if the internally generated substrate bias voltage Vbb is at a level that is higher than or lower than its nominal level, the substrate bias voltage can be adjusted to such level and permanently maintained at such level by programming the appropriate anti-fuse. For example, if it is determined that the substrate bias voltage Vbb should be maintained at the first increased level that is provided when test vector HIGHVBB1 is enabled, the anti-fuse circuit 57 is programmed in the conventional manner by blowing the anti-fuse 70. This causes the test signal output HFS1 provided by the anti-fuse circuit 57 to become a logic high level, and to be maintained at a logic high level. Whenever test signal HFS1 is at a logic high level, NOR gate 73 is disabled. Consequently, the complementary state test vector HIGHVBB1* generated by NOR gate 73 becomes a logic low level and the true state of the test vector HIGHVBB1 becomes a logic high level. This causes NAND gate 81 to be disabled, disabling test vector NORMVBB. Also, test vector HIGHVBB1 is enabled, causing transistor M8 to conduct so that the diode string D7–D11 is connected to node 48, raising the threshold setting for the output driver stage 44, and thus adjusting the substrate bias voltage Vbb to the first increased level. The substrate bias voltage Vbb will be maintained permanently at the first increased level that is established by programming of the anti-fuse. It is apparent that, by programming the appropriate anti-fuse, any one of the test vectors HIGHVBB1, HIGHVBB2, LOWVBB1 or LOWVBB2 can be provided permanently, to adjust the substrate bias voltage that is provided for the DRAM device 10.

Although in the exemplary embodiment the test vectors provide for adjustment of the substrate voltage in only four increments relative to its nominal value, further increments can be provided with the addition of at least further test mode circuits. Moreover, the substrate voltage can be adjusted to and maintained at such further adjusted levels through the addition of further anti-fuse circuits.

Figure 8:
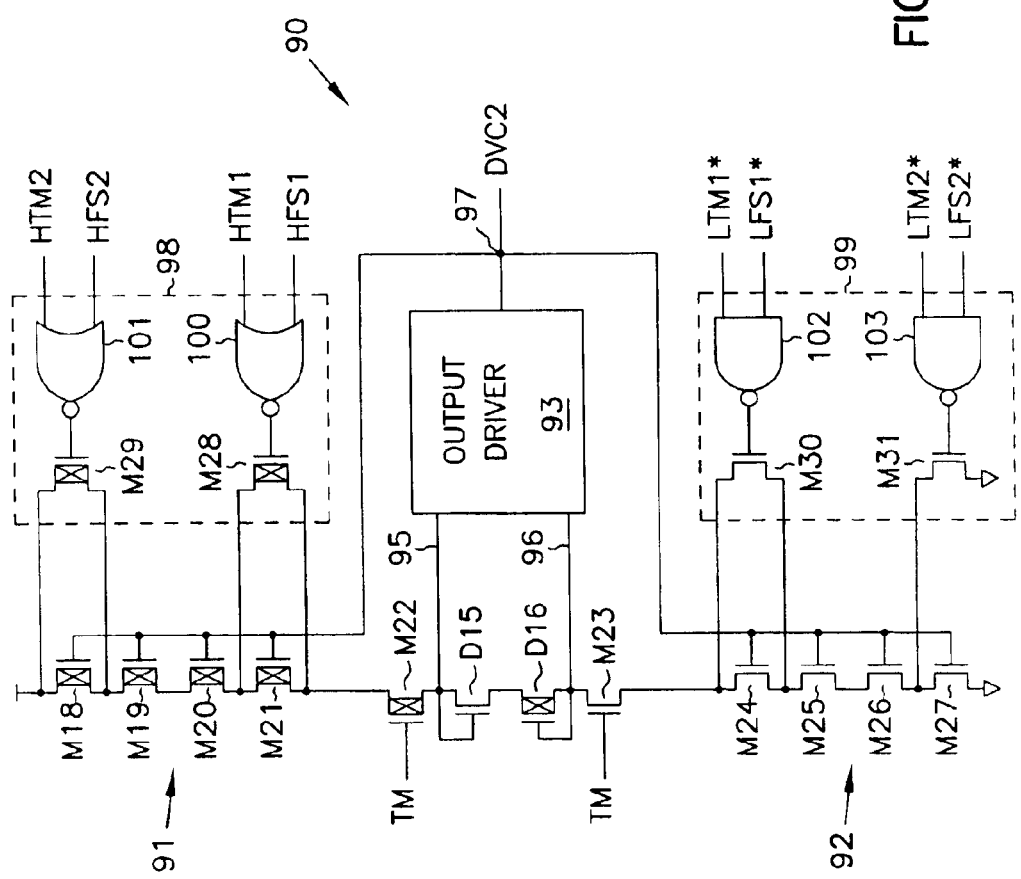
FIG. 8 is a schematic circuit and partial block diagram of a cellplate bias voltage generating circuit provided by the invention.

DVC2 Voltage Generating Circuit (FIG. 8)

Referring to FIG. 8, in accordance with a further embodiment of the invention, the test circuit includes an internal voltage generating circuit 90 which produces a reference or bias voltage that is equal to one-half the supply voltage Vcc (DVC2). Typically, the voltage DVC2 is used for equilibrating the digit lines of the DRAM device or for providing memory cellplate bias as is known in the art.

The invention allows the internally generated voltage DVC2 to be selectively increased and/or decreased in response to coded address signals supplied externally of the integrated circuit package and applied to the test enable circuit 23 (FIG. 1). This allows the DVC2 margin to be tested through external control by which the voltage DVC2 is increased for testing logic 1 level margin and is decreased for testing logic 0 level margin. Such margin tests are generally run on packaged DRAM devices.

Considering the test circuit in more detail, the internal voltage generating circuit 90 includes a pull-up stage 91, a pull-down stage 92 and an output driver stage 93. The pull-up stage includes p-type field-effect transistors M18–M22 which establish a fixed reference for the pull-up stage. The pull-down stage includes —type field-effect transistors M23–M27 which establish a fixed reference for the pull-down stage. Diode-connected —type field effect transistors D15 and D16, which are connected in series between transistors M22 and M23, provide bias for the output driver stage. The junction of the drain electrode of transistor M22 and diode-connected transistor D15 is connected to a node 95 at one input for the output driver stage 93. The junction of the drain electrode of transistor M23 and diode-connected transistor D16 is connected to a node 96 at a second input of the output driver stage 93. The gate electrodes of transistors M18–M21 are commonly connected together and to the output 97 of the output driver stage 93. Similarly, the gate electrodes of transistors M24–M27 are commonly connected together and to the output 97 of the output driver stage 93.

The signal generating circuit operates in the known way to maintain the voltage DVC2 appearing at the output 97 at a level that is one-half the supply voltage Vcc. Briefly, if the output voltage DVC2 at node 97 increases, the resultant increase in voltage at the gate electrodes of field-effect transistors M24–M27 causes these transistors to pull the potential at node 96 down toward ground. Also, the increase in the signal at the gate electrodes of transistors M18–M21 causes transistors M18–M21 to conduct less, allowing the potential at node 95 to decrease. As the voltage at node 96 is pulled toward ground and the voltage at node 95 is decreasing, the output driver transistor is biased on more, pulling node 97 towards ground, so that the output voltage DVC2 decreases back to Vcc/2. A complementary operation ensues when the output voltage DVC2 decreases with the transistors of the pull-up section 91 turning on harder and the transistors of the pull-down section 92 conducting less to return the output voltage DVC2 to Vcc/2.

In accordance with the invention, the signal generating circuit 90 includes a control circuit including a control circuit stage 98 associated with the pull-up stage 91, for controlling the reference circuit formed by transistors M18–M21 to change the setpoint, and a control circuit stage 99 associated with the pull-down stage 92 for controlling the reference circuit formed by transistors M24–M27 to change the setpoint. The control circuit stage 98 includes NOR gates 100 and 101 and p-type field-effect transistors M28 and M29. The control circuit stage 99 includes —type field-effect transistors M30 and M31 and NAND gates 102 and 103. The control circuit stages are responsive to a plurality of test vectors to provide incremental adjustment in the level of the voltage DVC2 that is provided by the signal generating circuit 90, allowing the voltage DVC2 to be increased in a plurality of increments and to be decreased in a plurality of increments.

Transistor M28 is connected in parallel with transistor M21 which is a long transistor. Transistor M29 is connected in parallel with transistor M18 which also is a long transistor. The gate electrode of transistor M28 is connected to the output of NOR gate 100 and the gate electrode of transistor M29 is connected to the output of NOR gate 101. The inputs of NOR gate 100 are connected to receive test signals, or test vectors HTM1 and HFS1. The inputs of NOR gate 101 are connected to receive test signals, or test vectors HTM2 and HFS2.

Similarly, transistor M30 is connected in parallel with transistor M24 which is a long transistor. Transistor M31 is connected in parallel with transistor M27 which also is a long transistor. The gate electrode of transistor M30 is connected to the output of NAND gate 102 and the gate electrode of transistor M31 is connected to the output of NAND gate 103. The inputs of NAND gate 102 are connected to receive test signals, or test vectors LTM1* and LFS1*. The inputs of NAND gate 103 are connected to receive test signals, or test vectors LTM2* and LFS2*. The test vectors can be generated by logic circuits including a plurality of test mode circuits, such as test mode circuit 56 shown in FIG. 5, and a plurality of anti-fuse circuits, such as anti-fuse circuit 57 shown in FIG. 6. The test vectors LTM1, LFS1, LTM2 and LFS2 are inverted by inverters, not shown, to produce the complementary states LTM1*, LFS1*, LTM2* and LFS2* for the test vectors.

This embodiment of a DVC2 voltage generating circuit provides for incremental adjustment of the level of the DVC2 voltage as well as allowing a level to which the DVC2 voltage has been adjusted to be maintained permanently, for establishing an adjusted operating level for the DVC2 voltage generating circuit. It is pointed out for the purpose of illustrating the DVC2 generating circuit according to the invention, the test signals are described as being generated by the test mode circuits and anti-fuse circuits FIGS. 5 and 6. However, separate test mode circuits and separate anti-fuse circuits would be provided for the substrate bias generating circuit of FIG. 4 and for the DVC2 voltage generating circuit of FIG. 8, and these circuits would be addressable by different coded addresses.

In operation of the voltage generating circuit 90, test vectors HTM1, HFS1, HTM2 and HFS2 are normally at a logic low level so that NOR gates 100 and 101 are enabled and transistors M28 and M29 are non-conducting. Test vectors LTM1*, LFS1*, LTM2* and LFS2* are normally at a logic high level so that NAND gates 102 and 103 are enabled and transistors M30 and M31 are non-conducting.

Digressing, in conducting a ones margin test, the voltage DVC2 is increased by activating the appropriate test vectors by supplying a coded address signal to the test mode enable circuit 23. To increase the voltage DVC2, temporarily, to a first increased level during testing of the memory device, test vector HTM1, for example, is enabled. When test vector HTM1 is enabled, NOR gate 100 is disabled and becomes a logic low level which causes transistor M28 to conduct. As a result transistor M28 diverts current around transistor M21 so that the potential at node 95 is raised up to Vcc. This raises the threshold setting for the DVC2 voltage generating circuit 90 so that the voltage DVC2 is adjusted upwardly to the first increased level. The voltage generating circuit 90 can be restored to its normal condition by disabling the test vector HTM1 through the application of a suitable coded signal to the test mode enable circuit.

Similarly, to increase temporarily the level of the voltage DVC2 to a second increased level, test vector HTM2 is activated. When test vector HTM2 is activated NOR gate 101 is disabled. This causes transistor M29 to conduct and divert current around transistor M18, shifting the threshold level for output driver stage 93, adjusting the voltage DVC2 upwardly to the second increased level.

To conduct a zeros margin test, the voltage DVC2 is decreased. The DVC2 zeros margin test is the opposite of the zeros margin test. To test for the ones margin, one of the test vectors LTM1* or LTM2* is enabled, causing the values of the voltage DVC2 to be decreased accordingly. The level of the voltage DVC2 can be decreased temporarily to a first decreased level by activating the test vector LTM1* or to a second decreased level by activating the test vector LTM2*.

In the former case, NAND gate 102 enables transistor M30 to provide a bypass path around transistor M24. In the latter case, NAND gate 103 enables transistor M31 to provide a bypass path around transistor M27.

Further in accordance with the invention, the DVC2 voltage generating circuit can be set to provide the voltage DVC2 at any one of these four adjusted levels, permanently, by programming the appropriate anti-fuse of the anti-fuse circuits 58, in the manner described above. This results in the selected one of the test vectors HFS1, HFS2, LFS1 and LFS2 being permanently enabled so that the adjusted value of the voltage DVC2 is provided. For example, if it is determined that the voltage DVC2 should be increased to the first increased level that is provided when test vector HTM1 is activated, the anti-fuse circuit 57 (FIG. 6) is programmed in the conventional manner by blowing the anti-fuse 70. This causes the output of the anti-fuse circuit to become a logic low level, disabling the NOR gate 100. This causes transistor M28 to conduct, bypassing transistor M21 which raises the threshold setting for the output driver circuit in the manner described above for activation of the test vector HTM1. The voltage DVC2 is maintained permanently at the first increased level that is established by programming of the anti-fuse 70. It is apparent that by programming the appropriate anti-fuse, any one of the test vectors HFS1, HFS2, LFS1 or LFS2 can be enabled permanently, so that the memory device will produce the adjusted level for the voltage DVC2.

Figure 9:
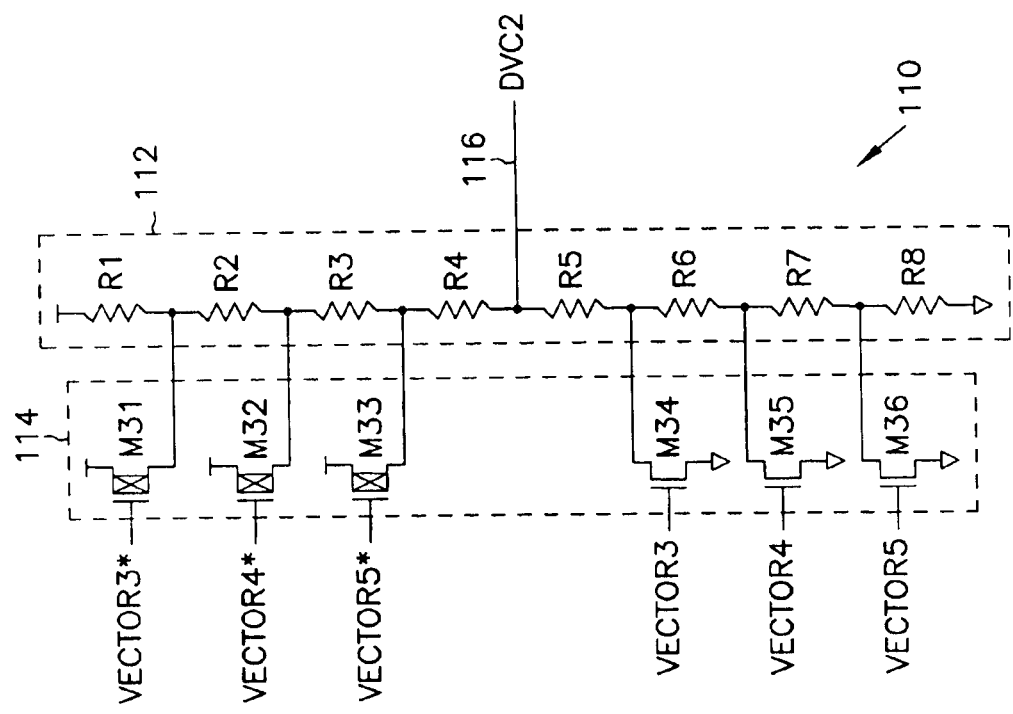
FIG. 9 is a schematic circuit and partial block diagram of another embodiment of a cellplate voltage generating circuit provided by the invention.

DVC2 Voltage Generating Circuit (FIG. 9)

Referring to FIG. 9, there is shown a further embodiment for a DVC2 generating circuit, circuit 110, which provides incremental control of the voltage DVC2 in accordance with the invention by selectively activating the test vectors Vector3*, Vector4*, Vector5*, Vector3, Vector4 and Vector5. In this embodiment, the level setting function is provided by a resistance voltage divider network 112 which is formed by resistors R1, R2, R3, R4, R5, R6, R7 and R8 which are connected in series between the Vcc supply rail and ground. In the exemplary embodiment, the resistors R1–R8 all have the same resistance value. However, the values of the resistances can be selected to provide a range of values to which the voltage DVC2 can be adjusted. Moreover, the DVC2 generating circuit can have fewer or more than eight resistors to establish the increments in which the voltage DVC2 can be adjusted.

The circuit 114 includes three p-channel field-effect transistors M31, M32 and M33, and three-channel field-effect transistors M34, M35 and M36. Transistor M31 has its source electrode connected to the Vcc supply rail, its drain electrode connected to the junction of resistors R1 and R2 and its gate electrode connected to receive test vector Vector3*. Transistor M32 has its source electrode connected to the Vcc supply rail, its drain electrode connected to the junction of resistors R2 and R3 and its gate electrode connected to receive test vector Vector4*. Transistor M33 has its source electrode connected to the Vcc supply rail, its drain electrode connected to the junction of resistors R3 and R4 and its gate electrode connected to receive test vector Vector5*. Transistor M34 has its source electrode connected to ground, its drain electrode connected to the junction of resistors R5 and R6 and its gate electrode connected to receive test vector Vector3*. Transistor M35 has its source electrode connected to ground, its drain electrode connected to the junction of resistors R6 and R7 and its gate electrode connected to receive test vector Vector3*. Transistor M36 has its source electrode connected to ground, its drain electrode connected to the junction of resistors R7 and R8 and its gate electrode connected to receive test vector Vector3*. The junction of resistors R4 and R5 at node 116 is the output of the DVC2 generating circuit 110.

The reference voltage DVC2 is maintained at one-half Vcc as long as none of the control transistors M31–M36 is conducting. The voltage DVC2 can be adjusted up or down relative to the nominal value by selectively enabling the transistors M31–M36 by activating the appropriate test vector.

For example, to conduct a zeros margin test, the value of the reference voltage DVC2 is decreased. This is done by activating one or more of the test vectors Vector3, Vector4 and Vector5, depending upon the magnitude of change that is desired in the reference voltage DVC2. The test vectors Vector4, Vector4*, Vector5 and Vector5* can be activated by supplying coded address signals to the test mode enable circuit 23 (FIG. 1) in the manner known in the art. For example, activating test vector Vector3 causes transistor M36 to conduct, diverting current around resistor R8 so that the reference voltage DVC2 is decreased.

To conduct a ones margin test, the value of the voltage DVC2 is increased. The DVC2 ones margin test is the opposite test of the zeros margin. To test for the ones margin, test vectors Vector3*, Vector4* and Vector5* can be selectively enabled. Therefore, the value of the voltage DVC2 is raised accordingly.

Figure 10:
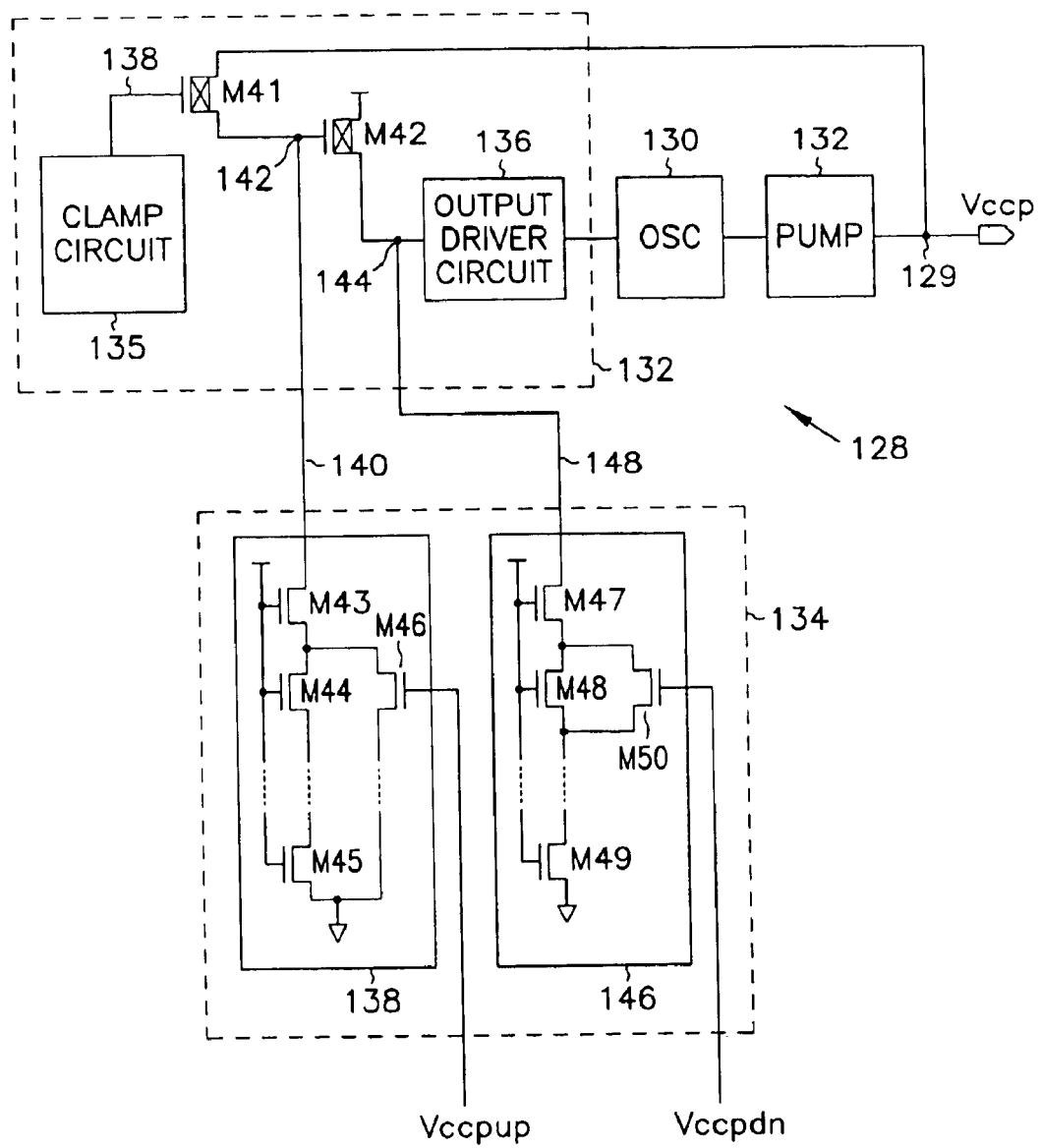
FIG. 10 is a schematic circuit and partial block diagram of a wordline bias voltage generating circuit provided by the invention.

Vccp Bias Generating Circuit (FIG. 10)

Referring to FIG. 10, there is illustrated a further embodiment of an internal voltage generating circuit 126 provided by the invention. The voltage generating circuit 126 is similar to the substrate bias voltage generating circuits 26 and 26' shown in FIGS. 2 and 3. The voltage generating circuit 126 controls a conventional oscillator 130 and a conventional charge pump circuit 132 which provide a pumped bias voltage Vccp.

The basic voltage generating circuit 126 is conventional and includes setpoint circuit 134, a high voltage clamp circuit 135 and output driver circuit 136. The high voltage clamp 135 and p-channel transistor M41 limit the voltage when the supply voltage Vcc is elevated, such as during component burn-in.

The setpoint circuit 134 includes a chain network or reference circuit 138 formed by a plurality of series connected —channel transistors M43, M44 . . . M45 shown in FIG. 10. The gate electrodes of the transistors M43, M44 . . . M45 are commonly connected to Vcc so that the transistors are gated on when power is applied to the voltage generating circuit. The chain network 138 has an input node 140 that is connected, at a node 142, to the gate electrode of a transistor M42, which has its source electrode connected to the Vcc supply rail and its drain electrode at node 144 connected to the input of the output driver stage.

The setpoint circuit 134 includes a further chain network or reference circuit 146 formed by a plurality of series connected —channel transistors M47, M48 . . . M49. The gate electrodes of the transistors M47, M48 . . . M49 are commonly connected to Vcc so that the transistors are gated on when power is applied to the voltage generating circuit. The chain network 146 has an input, at node 148, that is connected to node 144 at the input of the output driver stage.

In accordance with the invention, a control device, embodied as an —channel transistor M46, is connected in parallel with one or more of the transistors, such as transistors M44 . . . M45 for controlling the network to shift the setpoint level established by the network to provide an adjustment in the pumped bias voltage Vccp. The gate electrode of transistor M46 is connected to receive a test vector VCCPup. A further control device, embodied as an —channel transistor M50, is connected in parallel with one or more of the transistors, such as transistor M48 of network 146 to controlling the network to shift the setpoint established by the network to provide an adjustment in the pumped bias voltage Vccp. The gate electrode of transistor M50 is connected to receive a test vector VCCPdn.

The operation of regulating a portion of the voltage generating circuit illustrated in FIG. 10 is somewhat similar to the operation of the substrate bias voltage generating circuit shown in FIGS. 2 and 3 in that test vectors are used to selectively turn on field-effect transistors of control circuits of the voltage generating circuit to change the turn-on threshold for the threshold trip circuit of the reference voltage circuit. Chain network 138 clamps the voltage at node 142 to a level determined by the number of transistors in the chain network 138, and functions as a pull-up circuit, controlling the conduction of transistor M42 making the voltage at node 144 more positive depending upon the number of transistors of the chain network 138 that are bypassed by the control transistor M46. Similarly, chain network 146 limits the voltage at node 144 to a level determined by the number of transistors in the chain network 146, and functions as a pull-down circuit by making the voltage at node 144 more negative depending upon the number of transistors of the chain network 146 that are bypassed by the control transistor M50.

In this embodiment, test vector VCCPup enables transistor M46 providing a current shunt path around field effect transistors M44 . . . M45. The number of transistors that are provided in the chain network 138 and the number of transistors of the chain network that are shunted by the control transistor M46 are selected as a function of application. Also, although chain network 138 is shown to include only three transistors M43, M44 . . . M45, the chain network 138 can include more or fewer transistors.

Similarly, test vector VCCPdn enables transistor M50 providing a current bypass path around field-effect transistor M48. The number of transistors in the chain network 148 and the number of transistors that are shunted by the control transistor are selected as a function of application. Also, although chain network 148 is shown to include only three transistors M47, M48 . . . M49, the chain network 148 can include more or fewer transistors.

The operation of the Vccp voltage generating circuit 126 is conventional except for the provision of control transistors M46 and M50 which respond to test vectors to shift the trip level for the voltage generating circuit, in the manner of the voltage generating circuits described above with reference to FIGS. 2–9. Accordingly, the operation of the voltage generating circuit 126 will not be described in detail.

Figure 11:
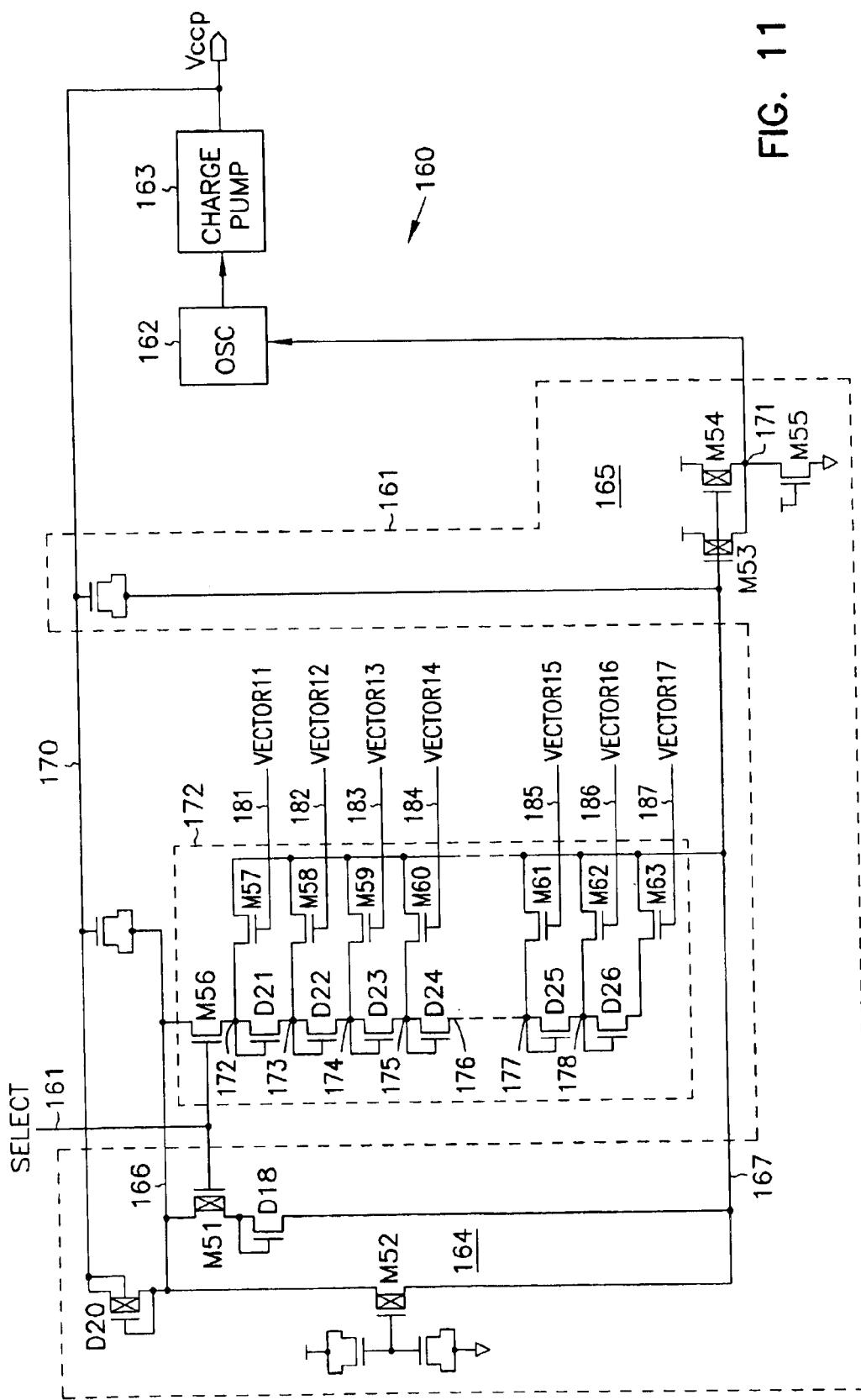
FIG. 11 is a schematic circuit diagram of and partial block diagram of a wordline bias voltage generating circuit in accordance with another embodiment of the invention.

Vccp Bias Generating Circuit (FIG. 11)

Referring to FIG. 11, there is illustrated a further embodiment of a voltage generating circuit provided by the invention. In this embodiment, the internal voltage generating circuit provides a pumped bias voltage Vccp. The voltage generating circuit 160 comprises a regulating circuit 161, an oscillator circuit 162 and a charge pump circuit 163. The oscillator circuit 162 and the charge pump circuit 163 are conventional circuits and will not be described.

The regulating circuit 161 includes a setpoint circuit 164 and an output driver circuit 165. The setpoint circuit 164 includes a p-channel field-effect transistor M51 and a diode-connected field-effect transistor D18 which are connected in series between an intermediate node 166 and a node 167 on which the trip level is established for the output driver stage.

The gate electrode of transistor M51 is connected to a node 169 which is coupled to a source of a test signal, or test vector SELECT. A further p-channel field-effect transistor M52 and a diode-connected field-effect transistor D20, which are connected between node 167 and as node 170, function as the input stage of the regulator circuit 163 and couple the pumped bias voltage Vccp, provided on node 170 at the output of the charge pump circuit 162 to the setpoint circuit 164.

The output driver circuit 165 includes parallel connected p-channel transistors M53 and M54 which are connected in series with an —channel field-effect transistor M55 between the Vcc supply rail and ground. The gate electrodes of transistors M53 and M54 are connected to node 167. The drain electrodes of transistors M53, M54 and M55 are commonly connected to node 171 which is the output of the output driver circuit 165 and is connected to the input of the charge pump circuit 162.

The voltage generating circuit further includes a control stage including a diode chain network 172 including diode-connected field-effect transistors D21–D26 and —channel field-effect transistor M56 which are connected in series between node 166 and node 167. Transistor M56 is connected to transistor D21 at node 172. Transistor D21 is connected to transistor D22 at node 173. Transistor D22 is connected to transistor D23 at node 174. Transistor D23 is connected to transistor D24 at node 175. Transistor D25 is connected to transistor D26 at node 178.

The control stage 172 further includes a plurality of —channel field-effect transistors M57–M53 which function as access or pass transistors for coupling the junction of adjacent ones of the transistors M56 and diode-connected transistors D21–D26 to node 167. For example, the junction of transistor M56 and transistor D21, at node 172 is connected to node 167 through the source-to-drain circuit of transistor M57. The junctions of adjacent ones of the transistors D21–D24, at nodes 173, 174 and 175 are connected to node 167 through the source-to-drain circuits of transistors M58, M59 and M50, respectively. Also nodes 177, 178 and 179 are connected to node 167 through the source-to-drain circuits of transistors M61, M62 and M63, respectively. The gate electrodes of transistors M57–M53 are connected to nodes 181–187 to receive test vectors Vector11-Vector17, respectively. The gate electrode of transistor M56 is connected to node 169 for receiving test vector SELECT. The test vectors Vector11-Vector17 and the vector SELECT can be activated by supplying coded address signals to the test mode enable circuit 23 (FIG. 1) as is known in the art. The test vectors can be activated only when the test mode is activated for the DRAM device 10 as is known in the art.

In operation of the test circuit illustrated in FIG. 11, the test vectors Vector11-Vector17 and the vector SELECT are used to connect the variable reference network 172 into the circuit and to selectively turn on the access transistors M57–M53. The access transistors M57–M53 are selectively turned on to determine the number of transistors D21–D26 that are active in the setpoint circuit. This provides a variable reference function that sets the turn-on threshold for the output driver circuit 165 which, in turn, controls the turn-on and the turn-off of the charge pump circuit 162.

Transistors M51 and M56 are controlled by test vector SELECT to reconfigure the control function rather than changing the voltage level produced by the setpoint circuit as is done in the previously described embodiments. More specifically, test vector SELECT is normally at logic low so that transistor M51 is conducting and transistor M56 is non-conducting. This condition represents the normal operating mode for the internal voltage generating circuit, wherein the turn-on threshold for the output driver circuit 165 is established by transistor M51 and D9. Transistor M51 and transistor D9 are connected between nodes 166 and 167 when transistor M51 is conducting. The bias voltage Vccp that is produced by the charge pump circuit 162 is coupled to node 166. When the bias voltage Vccp increases, in a positive direction, above the threshold value established by transistor M51 and diode-connected transistor D9, the output driver circuit is turned on, which in turn, turns on the charge pump circuit 162 to drive Vccp more negative in the conventional manner.

To enter the test mode, test vector SELECT is set to a logic high level to cause transistor M51 to become non-conducting and to cause transistor M56 to conduct. In addition, one of the test vectors Vector11-Vector17 is set to a logic high level so that its associated pass transistor conducts. For example, if test vector Vector13 is set to a logic high level, pass transistor M59 conducts. When transistors M56 and M59 are conducting, diode-connected transistors D21–D22 are connected between nodes 166 and 167 and transistor M56 and transistors D21–D22 establish the turn-on threshold for the output driver circuit 165. Different threshold levels can be provided by selecting different ones of the pass transistors M57–M63 using the test vectors Vector11-Vector17. When the test vector SELECT subsequently is set to a logic low level, transistor M56 becomes non-conducting and transistor M51 becomes conducting and the internal voltage generating circuit functions in the normal manner.

CONCLUSION

Thus, the invention provides an internal voltage generating circuit for generating an internal voltage for an integrated circuit device, such as an integrated circuit memory device, and a control circuit that is enabled in response to externally generated test signals to control the internal voltage generating circuit to adjust the internal voltage being generated. The internal voltage generating circuit can be one that provides a substrate bias voltage Vbb or a wordline bias voltage Vccp for the integrated circuit device. Alternatively, the internal voltage generating circuit can provide an internal voltage, such as the cellplate or equilibrating voltage DVC2 for the memory device. This arrangement allows these internally generated voltages to be controlled externally of the integrated circuit package, using the test mode feature of the integrated circuit device. Accordingly, functional circuits of the integrated circuit device can be tested by incrementally adjusting these internally generated voltages while the integrated circuit device is being operated in the test mode. In accordance with another aspect of the invention, the internal voltage can be maintained permanently at one of the levels to which it has been adjusted by programming a programmable logic device, such as an anti-fuse. An anti-fuse circuit is coupled to the control circuit to cause the control circuit to override the regulating circuit of the voltage generating circuit so that the internal voltage is maintained at the level to which it has been adjusted.

What is claimed is:

1. A system for testing an integrated circuit device comprising:
    a voltage generating circuit to produce a plurality of test voltages, each of the plurality of test voltages having a different magnitude; and
    a test circuit to send a plurality of test signals to the voltage generating circuit and enable the voltage generating circuit to produce one of the plurality of test voltages, wherein the plurality of test voltages correspond to the plurality of test signals.

2. The system of claim 1, wherein the voltage generating circuit comprises:
   a voltage producing circuit to produce a voltage; and
   a regulating circuit coupled to the voltage producing circuit to maintain the voltage at a setpoint value.

3. The system of claim 2, further comprising:
   a control circuit coupled to the voltage generating circuit, the control circuit adapted to be responsive to the at least one test signal to incrementally adjust the voltage to produce one of the plurality of test voltages based on the at least one test signal.

4. A system comprising:
   an integrated circuit device;
   a voltage producing circuit located within the integrated circuit device to produce a voltage; and
   a control circuit coupled to the voltage producing circuit and located within the integrated circuit device to provide a selected one of a plurality of voltage increments with respect to the voltage according to an external signal allowing the control circuit to be controlled externally of the integrated circuit device.

5. The system of claim 4, further comprising a regulatory circuit to maintain the voltage at a setpoint value.

6. The system of claim 4, further comprising at least one programmable circuit coupled to the control circuit, the programmable circuit being programmable to provide an output signal to cause the control circuit to permanently maintain the voltage at a level to which the voltage is adjusted.

7. A system enclosed within a package comprising:
   an integrated circuit;
   a voltage generating circuit coupled to the integrated circuit comprising:
      a voltage producing circuit to produce a voltage; and
      a voltage regulating circuit coupled to the voltage producing circuit to maintain the voltage at a setpoint value;
   a test mode enabling circuit coupled to the integrated circuit and adapted to cause the integrated circuit to enter a test mode in response to an external signal;
   a test circuit coupled to the voltage generating circuit and adapted to generate test vector signals in response to coded signals generated external of the package, and wherein the test vector signals represent incremental adjustments in the voltage; and
   a control circuit coupled to the voltage generating circuit and the test circuit to incrementally adjust the voltage to a desired one of a plurality of voltages in response to the test vector signals to provide a plurality of voltages of different magnitudes.

8. The system of claim 7, wherein the integrated circuit is a memory device.

9. The system of claim 8, wherein the voltage is a negative substrate bias voltage that is applied to the substrate of the memory device.

10. An integrated circuit comprising:
    a memory device;
    a voltage generating circuit coupled to the memory device to produce a voltage at a setpoint value;
    a test mode enable circuit coupled to the voltage generating circuit to cause the integrated circuit device to operate in a test mode in response to coded signals generated externally of the package and applied to signal inputs of the integrated circuit device;
    a test circuit to produce a plurality of test signals coupled to the voltage generating circuit, each of the test signals representing a different voltage magnitude; and
    a control circuit coupled to the voltage generating circuit and responsive to the test signals to incrementally adjust the voltage relative to the setpoint value to provide a plurality of test voltages of different magnitudes for testing the memory device.

11. The integrated circuit of claim 10, wherein the control circuit includes a plurality of control devices to change the setpoint value to cause a corresponding change in the plurality of test voltages.

12. An integrated circuit comprising:
    a memory device;
    a voltage generating circuit coupled to the memory device comprising:
       a voltage producing circuit to produce a bias voltage; and
       a regulating circuit coupled to the voltage producing circuit to maintain the bias voltage at a setpoint value and to incrementally adjust a magnitude of the voltage relative to the setpoint value to provide a plurality of voltages of different magnitudes;
    a test mode enable circuit coupled to the voltage generating circuit to cause the integrated circuit device to operate in a test mode in response to a test signal generated externally of the package and applied to a signal input of the integrated circuit;
    a test circuit to produce a plurality of test signals coupled to the voltage generating circuit, wherein each of the test signals represents a different adjustment value and wherein each test signal is produced in response to an external coded signal; and
    a control circuit coupled to the voltage generating circuit and adapted to respond to the test signals to control the regulating circuit as a function of the test signals to incrementally adjust a magnitude of the bias voltage produced by the voltage producing circuit to provide a plurality of voltages of different magnitudes.

13. The integrated circuit of claim 12, wherein the control circuit includes a plurality of control devices to change the setpoint value to cause a corresponding change in the plurality of test voltages.

14. An integrated circuit comprising:
    a memory device;
    a voltage generating circuit coupled to the memory device to produce a voltage at a setpoint value and to incrementally adjust a magnitude of the voltage relative to the setpoint value to provide a plurality of voltages of different magnitudes;
    a test mode enable circuit coupled to the voltage generating circuit to cause the integrated circuit device to operate in a test mode in response to coded signals generated externally of the package and applied to signal inputs of the integrated circuit device;
    a test circuit to produce a plurality of test signals coupled to the voltage generating circuit, each of the test signals representing a different value for the voltage to be produced by the voltage generating circuit; and
    a control circuit coupled to the voltage generating circuit comprising:
       a first circuit device adapted to respond to a first test signal of the plurality of test signals and cause the voltage generating circuit to adjust the magnitude of the voltage to a first adjusted value; and a second circuit device adapted to respond to a second test signal of the plurality of test signals and cause the voltage generating circuit to adjust the magnitude of the voltage to a second adjusted value.

15. The integrated circuit of claim 14, wherein the voltage generating circuit includes a fixed reference circuit to establish the setpoint value, wherein the control circuit includes at least one circuit device adapted to respond to an externally generated signal applied to the integrated circuit device to override the fixed reference circuit and adjust the voltage relative to the setpoint value.

16. A system for testing an integrated circuit device comprising:

a voltage generating circuit to produce a plurality of test voltages, each of the plurality of test voltages having a different magnitude;

a test circuit to produce at least one test signal coupled to the voltage generating circuit wherein each of the at least one test signal represents a different voltage to be produced by the voltage generating circuit;

a control circuit coupled to the voltage generating circuit to incrementally adjust a voltage in response to the at least one test signal; and a programmable circuit coupled to the control circuit to control the control circuit, and to provide an output signal, wherein the control circuit is adapted to cause the voltage generating circuit to adjust the voltage produced by the voltage generating circuit in response to the output signal.

17. The system of claim 16, wherein the programmable circuit is programmed externally of the system.

18. The system of claim 16, wherein the programmable circuit is programmed to cause the voltage to adjust to a digitline equilibrating voltage.

19. A system for testing an integrated circuit device comprising:

a voltage generating circuit to produce a voltage at a setpoint value and to selectively increment a voltage with a plurality of voltage increments with respect to the setpoint value to provide a plurality of test voltages, each of the plurality of test voltages having a different magnitude;

a test mode enable circuit coupled to the voltage generating circuit to cause the integrated circuit device to enter a test mode on receiving a test signal; and a test control circuit coupled to the voltage generating circuit to cause the voltage generating circuit to selectively increment the voltage relative to the setpoint value to provide a desired test voltage selected from the plurality of test voltages.

20. The system of claim 19, wherein the setpoint value is a bias voltage.

21. The system of claim 19, wherein the setpoint value is a bias voltage and wherein the plurality of incremental adjustments are a plurality of discrete shifts in the level of the bias voltage.

22. A system for testing an integrated circuit device comprising:

a voltage generating circuit to produce a voltage at a setpoint value and to selectively increment a voltage with a plurality of voltage increments to provide the plurality of test voltages, each of the plurality of test voltages having a different magnitude;

a test control circuit coupled to the voltage generating circuit to cause the voltage generating circuit to selectively increment the voltage relative to the setpoint value to provide a desired test voltage selected form the plurality of test voltages; and a programmable circuit coupled to the voltage generating circuit to modify the setpoint value corresponding to a modify signal.

23. The system of claim 22, wherein the voltage generating circuit, the test control circuit, the programmable circuit and the integrated circuit device are housed in a package and the modify signal is generated externally of the package.

24. The system of claim 22, further comprising:

a test mode enable circuit coupled to the voltage generating circuit to cause the integrated circuit device to enter a test mode on receiving a test signal.

25. A system for producing test voltages for use in testing an integrated circuit device comprising:

an integrated circuit device;

a voltage producing circuit located within the integrated circuit device to produce a voltage and a plurality of voltage increments with respect to the voltage; and a control circuit coupled to the voltage producing circuit and located within the integrated circuit device to incrementally adjust the voltage with a selected one of the plurality of voltage increments according to an external signal allowing the control circuit to be controlled externally of the integrated circuit device.

26. The system of claim 25, further comprising a fixed reference circuit to establish the setpoint value, wherein the control circuit includes at least one circuit device adapted to respond to an externally generated signal applied to the integrated circuit device to override the fixed reference circuit and adjust the voltage relative to the setpoint value.

27. A system for producing test voltages enclosed within a package comprising:

an integrated circuit;

a voltage generating circuit coupled to the integrated circuit comprising:

a voltage producing circuit to produce a voltage; and a voltage regulating circuit coupled to the voltage producing circuit to maintain the voltage at a setpoint value;

a test mode enabling circuit coupled to the integrated circuit and adapted to cause the integrated circuit to enter a test mode in response to an external signal;

a test circuit coupled to the voltage generating circuit to generate test vector signals in response to coded signals generated external of the package, and wherein the test vector signals represent incremental adjustments in the voltage; and a control circuit coupled to the voltage generating circuit to incrementally adjust the voltage in response to the test vector signals for testing the integrated circuit to provide a plurality of voltages of different magnitudes.

28. The system of claim 27, wherein the integrated circuit is a memory device.

29. The system of claim 27, wherein the voltage is a negative substrate bias voltage that is applied to the substrate of the memory device.

30. A system for producing test voltages in an integrated circuit comprising:

a memory device;

a voltage generating circuit coupled to the memory device to produce a voltage at a setpoint value;

a test mode enable circuit coupled to the voltage generating circuit to cause the integrated circuit device to operate in a test mode in response to coded signals generated externally of the package and applied to signal inputs of the integrated circuit device;

a test circuit to produce a plurality of test signals coupled to the voltage generating circuit, each of the test signals representing a different value for the voltage to be produced by the voltage generating circuit; and a control circuit coupled to the voltage generating circuit and adapted to respond to the test signals to incrementally adjust the voltage relative to the setpoint value for testing the memory device to provide a selected one of a plurality of voltages.

31. The system of claim 30, wherein the control circuit includes a plurality of control devices to control a fixed reference circuit to change the setpoint value to cause a corresponding change in the value for the voltage.

32. A system for producing test voltages for testing an integrated circuit device comprising:

a voltage generating circuit;

a test circuit to produce at least one test signal coupled to the voltage generating circuit wherein each of the at least one test signal represents a different voltage to be produced by the voltage generating circuit;

a control circuit coupled to the voltage generating circuit to incrementally adjust a voltage in response to the at least one test signal to a selected one of a plurality of voltage increments; and a programmable circuit coupled to the control circuit to control the control circuit, wherein the programmable circuit is adapted to provide an output signal and the control circuit is adapted to cause the voltage generating circuit to adjust the voltage produced by the voltage generating circuit in response to the output signal.

33. The system of claim 32, wherein the programmable circuit is programmed externally of the system.

34. The system of claim 32, wherein the programmable circuit is programmed to cause the voltage to adjust to a digitline equilibrating voltage.

35. A system for producing test voltages for testing an integrated circuit device comprising:

a voltage generating circuit to produce a voltage at a setpoint value;

a test mode enable circuit coupled to the voltage generating circuit to cause the integrated circuit device to enter a test mode on receiving a test signal; and a test control circuit coupled to the voltage generating circuit to cause the voltage generating circuit to perform a plurality of incremental adjustments to the voltage relative to the setpoint value.

36. The system of claim 35, wherein the setpoint value is a bias voltage.

37. The system of claim 35, wherein the setpoint value is a bias voltage and wherein the plurality of incremental adjustments are a plurality of discrete shifts in the level of the bias voltage.

38. A system for producing test voltages for testing an integrated circuit device comprising:

a voltage generating circuit to produce a voltage at a setpoint value;

a test control circuit coupled to the voltage generating circuit to cause the voltage generating circuit to perform a plurality of incremental adjustments to the voltage relative to the setpoint value; and a programmable circuit coupled to the voltage generating circuit to modify the setpoint value corresponding to a modify signal.

39. The system of claim 38, wherein the voltage generating circuit, the test control circuit, the programmable circuit and the integrated circuit device are housed in a package and the modify signal is generated externally of the package.

40. The system of claim 39, further comprising:

a test mode enable circuit coupled to the voltage generating circuit to cause the integrated circuit device to enter a test mode on receiving a test signal.

* * * * *